US008680587B2

(12) United States Patent
Henning et al.

(10) Patent No.: US 8,680,587 B2
(45) Date of Patent: Mar. 25, 2014

(54) SCHOTTKY DIODE

(75) Inventors: Jason Patrick Henning, Carrboro, NC (US); Qingchun Zhang, Cary, NC (US); Sei-Hyung Ryu, Cary, NC (US); Anant Agarwal, Chapel Hill, NC (US); John Williams Palmour, Cary, NC (US); Scott Allen, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/229,749

(22) Filed: Sep. 11, 2011

(65) Prior Publication Data

US 2013/0062723 A1 Mar. 14, 2013

(51) Int. Cl.
*H01L 29/66* (2006.01)

(52) U.S. Cl.
USPC .......... 257/267; 257/155; 257/E33.051; 257/E27.068

(58) Field of Classification Search
USPC ............ 439/92, 570; 257/475, 484, E51.009, 257/267, 155, E33.051, E27.068
See application file for complete search history.

(56) References Cited

U.S. PATENT DOCUMENTS

| | | |
|---|---|---|
| 3,439,189 A | 4/1969 | Petry |
| 3,629,011 A | 12/1971 | Tohi et al. |
| 3,924,024 A | 12/1975 | Naber et al. |
| 4,160,920 A | 7/1979 | Courier de Méré |
| 4,242,690 A | 12/1980 | Temple |
| 4,466,172 A | 8/1984 | Batra |
| 4,570,328 A | 2/1986 | Price et al. |
| 4,581,542 A | 4/1986 | Steigerwald |
| 4,641,174 A | 2/1987 | Baliga |
| 4,644,637 A | 2/1987 | Temple |
| 4,811,065 A | 3/1989 | Cogan |
| 4,827,322 A | 5/1989 | Takata |
| 4,875,083 A | 10/1989 | Palmour |
| 4,927,772 A | 5/1990 | Arthur et al. |
| 4,945,394 A | 7/1990 | Palmour et al. |
| 4,946,547 A | 8/1990 | Palmour et al. |
| 5,011,549 A | 4/1991 | Kong et al. |
| 5,017,976 A | 5/1991 | Sugita |
| 5,028,977 A | 7/1991 | Kenneth et al. |
| 5,032,888 A | 7/1991 | Seki |
| 5,041,881 A | 8/1991 | Bishop et al. |

(Continued)

FOREIGN PATENT DOCUMENTS

| | | |
|---|---|---|
| CN | 1259228 A | 7/2000 |
| DE | 3942640 A1 | 8/1990 |

(Continued)

OTHER PUBLICATIONS

International Search Report for US Patent Application No. 2010/0025053, mailed May 3, 2010, 7 pages.

(Continued)

*Primary Examiner* — Jarrett Stark
*Assistant Examiner* — Shahed Ahmed
(74) *Attorney, Agent, or Firm* — Withrow & Terranova, P.L.L.C.

(57) ABSTRACT

The present disclosure generally relates to a Schottky diode that has a substrate, a drift layer provided over the substrate, and a Schottky layer provided over an active region of the drift layer. The metal for the Schottky layer and the semiconductor material for the drift layer are selected to provide a low barrier height Schottky junction between the drift layer and the Schottky layer.

38 Claims, 19 Drawing Sheets

(56) References Cited

U.S. PATENT DOCUMENTS

| | | |
|---|---|---|
| 5,111,253 A | 5/1992 | Korman et al. |
| 5,155,289 A | 10/1992 | Bowles |
| 5,166,760 A | 11/1992 | Mori et al. |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,262,669 A | 11/1993 | Wakatabe et al. |
| 5,270,554 A | 12/1993 | Palmour |
| 5,292,501 A | 3/1994 | Degenhardt et al. |
| 5,296,395 A | 3/1994 | Khan et al. |
| 5,342,803 A | 8/1994 | Shimoji |
| 5,345,100 A | 9/1994 | Kan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,399,887 A | 3/1995 | Weitzel et al. |
| 5,459,107 A | 10/1995 | Palmour |
| 5,468,654 A | 11/1995 | Harada |
| 5,473,176 A | 12/1995 | Kakumoto |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal et al. |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,753,960 A | 5/1998 | Dickmann |
| 5,763,905 A | 6/1998 | Harris |
| 5,767,540 A | 6/1998 | Shimizu |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,977,605 A | 11/1999 | Bakowski et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,728 A | 4/2000 | Harada et al. |
| 6,057,352 A | 5/2000 | Brown et al. |
| 6,063,698 A | 5/2000 | Tseng et al. |
| 6,083,814 A | 7/2000 | Nilsson |
| 6,096,607 A | 8/2000 | Ueno |
| 6,097,046 A | 8/2000 | Plumton |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schörner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,501,145 B1 | 12/2002 | Kaminski et al. |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,649,995 B2 | 11/2003 | Tooi et al. |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,949,401 B2 | 9/2005 | Kaminski et al. |
| 6,956,238 B2 | 10/2005 | Ryu et al. |
| 6,976,936 B2 | 12/2005 | Yamaoka et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,183,575 B2 | 2/2007 | Shimoida et al. |
| 7,186,609 B2 | 3/2007 | Korec et al. |
| 7,221,010 B2 | 5/2007 | Ryu |
| 7,253,031 B2 | 8/2007 | Takahashi et al. |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,547,578 B2 | 6/2009 | Agarwal et al. |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 7,781,786 B2 | 8/2010 | Hayashi et al. |
| 7,851,881 B1 | 12/2010 | Zhao et al. |
| 7,893,467 B2 | 2/2011 | Yamamoto et al. |

(56) References Cited

U.S. PATENT DOCUMENTS

| | | | |
|---|---|---|---|
| 7,902,054 B2* | 3/2011 | Tsuchida et al. | 438/534 |
| 7,994,033 B2 | 8/2011 | Yoshii | |
| 8,168,582 B2 | 5/2012 | Blanco et al. | |
| 2001/0055852 A1 | 12/2001 | Moise et al. | |
| 2002/0030191 A1 | 3/2002 | Das et al. | |
| 2002/0038891 A1 | 4/2002 | Ryu et al. | |
| 2002/0047125 A1 | 4/2002 | Fukuda et al. | |
| 2002/0072247 A1 | 6/2002 | Lipkin et al. | |
| 2002/0102358 A1 | 8/2002 | Das et al. | |
| 2002/0121641 A1 | 9/2002 | Alok et al. | |
| 2002/0125482 A1 | 9/2002 | Friedrichs et al. | |
| 2002/0125541 A1 | 9/2002 | Korec et al. | |
| 2003/0025175 A1 | 2/2003 | Asano et al. | |
| 2003/0057482 A1 | 3/2003 | Harada | |
| 2003/0107041 A1 | 6/2003 | Tanimoto et al. | |
| 2003/0137010 A1 | 7/2003 | Friedrichs et al. | |
| 2003/0178672 A1 | 9/2003 | Hatakeyama et al. | |
| 2003/0201455 A1 | 10/2003 | Takahashi et al. | |
| 2004/0016929 A1 | 1/2004 | Nakatsuka et al. | |
| 2004/0079989 A1 | 4/2004 | Kaneko et al. | |
| 2004/0082116 A1 | 4/2004 | Kub et al. | |
| 2004/0173801 A1 | 9/2004 | Willmeroth | |
| 2004/0183079 A1 | 9/2004 | Kaneko et al. | |
| 2004/0211980 A1 | 10/2004 | Ryu | |
| 2004/0212011 A1 | 10/2004 | Ryu | |
| 2004/0256659 A1 | 12/2004 | Kim et al. | |
| 2004/0259339 A1 | 12/2004 | Tanabe et al. | |
| 2005/0001268 A1* | 1/2005 | Baliga | 257/341 |
| 2005/0012143 A1 | 1/2005 | Tanaka et al. | |
| 2005/0062124 A1 | 3/2005 | Chiola | |
| 2005/0104072 A1 | 5/2005 | Slater, Jr. et al. | |
| 2005/0139936 A1 | 6/2005 | Li | |
| 2005/0151138 A1 | 7/2005 | Slater, Jr. et al. | |
| 2005/0181536 A1 | 8/2005 | Tsuji | |
| 2005/0224838 A1 | 10/2005 | Tanaka et al. | |
| 2005/0245034 A1 | 11/2005 | Fukuda et al. | |
| 2005/0275055 A1 | 12/2005 | Parthasarathy et al. | |
| 2006/0011128 A1 | 1/2006 | Ellison et al. | |
| 2006/0060884 A1 | 3/2006 | Ohyanagi et al. | |
| 2006/0065899 A1 | 3/2006 | Hatakeyama et al. | |
| 2006/0086997 A1 | 4/2006 | Kanaya et al. | |
| 2006/0211210 A1 | 9/2006 | Bhat et al. | |
| 2006/0244010 A1 | 11/2006 | Saxler | |
| 2006/0255423 A1 | 11/2006 | Ryu et al. | |
| 2006/0261347 A1 | 11/2006 | Ryu et al. | |
| 2006/0261876 A1 | 11/2006 | Agarwal et al. | |
| 2006/0267021 A1 | 11/2006 | Rowland et al. | |
| 2007/0066039 A1 | 3/2007 | Agarwal et al. | |
| 2007/0120148 A1 | 5/2007 | Nogome | |
| 2007/0164321 A1 | 7/2007 | Sheppard et al. | |
| 2007/0228505 A1 | 10/2007 | Mazzola et al. | |
| 2007/0235745 A1 | 10/2007 | Hayashi et al. | |
| 2007/0241427 A1 | 10/2007 | Mochizuki et al. | |
| 2008/0001158 A1 | 1/2008 | Das et al. | |
| 2008/0006848 A1 | 1/2008 | Chen et al. | |
| 2008/0029838 A1 | 2/2008 | Zhang et al. | |
| 2008/0105949 A1 | 5/2008 | Zhang et al. | |
| 2008/0191304 A1 | 8/2008 | Zhang et al. | |
| 2008/0197439 A1 | 8/2008 | Goerlach et al. | |
| 2008/0230787 A1 | 9/2008 | Suzuki et al. | |
| 2008/0246085 A1 | 10/2008 | Saito et al. | |
| 2008/0251793 A1 | 10/2008 | Mazzola et al. | |
| 2008/0277669 A1 | 11/2008 | Okuno et al. | |
| 2008/0296771 A1 | 12/2008 | Das et al. | |
| 2009/0008651 A1 | 1/2009 | Okuno et al. | |
| 2009/0085064 A1 | 4/2009 | Rueb et al. | |
| 2009/0121319 A1 | 5/2009 | Zhang et al. | |
| 2009/0146154 A1 | 6/2009 | Zhang et al. | |
| 2009/0212301 A1 | 8/2009 | Zhang et al. | |
| 2009/0267141 A1* | 10/2009 | Matocha et al. | 257/329 |
| 2009/0267200 A1 | 10/2009 | Gutt et al. | |
| 2009/0272983 A1 | 11/2009 | Kumar et al. | |
| 2009/0289262 A1 | 11/2009 | Zhang et al. | |
| 2010/0032685 A1 | 2/2010 | Zhang et al. | |
| 2010/0133549 A1 | 6/2010 | Zhang et al. | |
| 2010/0133550 A1 | 6/2010 | Zhang et al. | |
| 2010/0140628 A1 | 6/2010 | Zhang | |
| 2010/0244047 A1 | 9/2010 | Hull et al. | |
| 2010/0277839 A1* | 11/2010 | Nicholson et al. | 361/54 |
| 2011/0204435 A1* | 8/2011 | Disney | 257/329 |
| 2011/0207321 A1* | 8/2011 | Fujiwara et al. | 438/663 |
| 2011/0215338 A1* | 9/2011 | Zhang | 257/73 |
| 2012/0256192 A1* | 10/2012 | Zhang et al. | 257/77 |
| 2012/0280270 A1* | 11/2012 | Ryu et al. | 257/133 |

FOREIGN PATENT DOCUMENTS

| | | |
|---|---|---|
| DE | 4210402 A1 | 10/1992 |
| DE | 29504629 U1 | 8/1995 |
| DE | 19633183 A1 | 2/1998 |
| DE | 19633184 A1 | 2/1998 |
| DE | 19723176 C1 | 8/1998 |
| DE | 19809554 A1 | 9/1998 |
| DE | 19900171 A1 | 7/1999 |
| DE | 10036208 A1 | 2/2002 |
| EP | 0176778 A2 | 4/1986 |
| EP | 0192229 A2 | 8/1986 |
| EP | 0269294 A1 | 6/1988 |
| EP | 0380340 A2 | 8/1990 |
| EP | 0389863 A1 | 10/1990 |
| EP | 0735591 A1 | 10/1996 |
| EP | 0837508 A2 | 4/1998 |
| EP | 0865085 A1 | 9/1998 |
| EP | 0992070 A1 | 4/2000 |
| EP | 1361614 A1 | 11/2003 |
| EP | 1460681 A2 | 9/2004 |
| EP | 1693896 A1 | 8/2006 |
| EP | 1806787 A1 | 7/2007 |
| EP | 1845561 A2 | 10/2007 |
| EP | 2015364 A2 | 1/2009 |
| EP | 2259326 A1 | 12/2010 |
| JP | 60240158 A | 11/1985 |
| JP | 362136072 A | 6/1987 |
| JP | 01117363 A | 5/1989 |
| JP | 2137368 A | 5/1990 |
| JP | 03034466 A | 2/1991 |
| JP | 03105975 A | 5/1991 |
| JP | 03157974 A | 7/1991 |
| JP | 03225870 A | 10/1991 |
| JP | 7066433 A | 3/1995 |
| JP | 08097441 A | 4/1996 |
| JP | 08264766 A | 10/1996 |
| JP | 08316164 | 11/1996 |
| JP | 09009522 A | 1/1997 |
| JP | 09205202 A | 8/1997 |
| JP | 11008399 A | 1/1999 |
| JP | 11191559 A | 7/1999 |
| JP | 11238742 A | 8/1999 |
| JP | 11261061 A | 9/1999 |
| JP | 11266017 A | 9/1999 |
| JP | 11274487 A | 10/1999 |
| JP | 2000049167 A | 2/2000 |
| JP | 2000077682 A | 3/2000 |
| JP | 2000082812 A | 3/2000 |
| JP | 2000106371 A | 4/2000 |
| JP | 2000252478 A | 9/2000 |
| JP | 2001085704 A | 3/2001 |
| JP | 2002314099 A | 10/2002 |
| JP | 2006324585 A | 11/2006 |
| JP | 2008042198 A | 2/2008 |
| WO | 9708754 A2 | 3/1997 |
| WO | 9802924 A2 | 1/1998 |
| WO | 9808259 A1 | 2/1998 |
| WO | 9832178 A1 | 7/1998 |
| WO | 2006135031 A2 | 12/2006 |
| WO | 2007040710 A1 | 4/2007 |

OTHER PUBLICATIONS

Invitation to Pay Additional Fee for US Patent Application No. 2007/0010192, mailed Oct. 29, 2007, 10 pages.

Notice of Transmittal of International Search Report and Written Opinion for PCT/US2008/004239, mailed Mar. 2, 2009, 14 pages.

(56) References Cited

OTHER PUBLICATIONS

Notice of Transmittal of International Search Report for US Patent Application No. 2010/0026632, mailed Oct. 8, 2010, 16 pages.
Notice of Transmittal of International Search Report for US Patent Application No. 2010/0028612, mailed Jun. 17, 2010, 10 pages.
Notice of Transmittal of International Search Report for US Patent Application No. 2010/0035713, mailed Jul. 27, 2010, 14 pages.
Notice of Transmittal of International Search Report for US Patent Application No. 2010/0042075, mailed Sep. 24, 2010, 15 pages.
Notification Concerning Transmittal of International Preliminary Report on Patentability for International Application No. PCT/US2011/027383, mailed Sep. 20, 2012, 7 pages.
International Preliminary Report on Patentability for US Patent Application No. 2007/0010192, mailed Sep. 23, 2008, 9 pages.
Notice of Allowance for U.S. Appl. No. 12/124,341, mailed Apr. 9, 2012, 8 pages.
Japanese Office Action for Japanese Patent Application No. 2011-510504, mailed Mar. 26, 2013, 2 pages.
European Search Report for European Patent Application No. 09750952.5-1235, mailed Mar. 8, 2012, 5 pages.
International Preliminary Report on Patentability for International Patent Application No. PCT/US2009/003089, mailed Nov. 23, 2010, 7 pages.
International Search Report for Patent Application No. PCT/2012/27874, mailed Jul. 13, 2012, 7 pages.
Non-Final Office Action for U.S. Appl. No. 13/547,014, mailed Nov. 9, 2012, 13 pages.
Final Office Action for U.S. Appl. No. 13/547,014, mailed Apr. 4, 2013, 8 pages.
Japanese Office Action for Japanese Patent Application No. 2011-510504, mailed Apr. 26, 2013, 8 pages.
Final Office Action for U.S. Appl. No. 12/719,412, mailed Jul. 31, 2013, 19 pages.
Advisory Action for U.S. Appl. No. 13/547,014, mailed Jul. 31, 2013, 3 pages.
Notice of Allowance for U.S. Appl. No. 13/229,750, mailed Aug. 23, 2013, 8 pages.
Final Office Action for U.S. Appl. No. 13/229,752, mailed Jul. 29, 2013, 6 pages.
Notice of Allowance for U.S. Appl. No. 13/547,014, mailed Aug. 30, 2013, 8 pages.
Notice of Allowance for U.S. Appl. No. 13/229,752, mailed Oct. 10, 2013, 10 pages.
Advisory Action for U.S. Appl. No. 12/719,412, mailed Oct. 15, 2013, 3 pages.
Afanasev, V. et al., "Intrinsic SiC/SiO2 Interface States", Phys. Stat. Sol., Received Jan. 31, 1997, vol. 162, pp. 321-337.
Agarwal, A.K. et al., "1.1 kV 4H-SiC Power UMOSFETs", IEEE Electron Devices Letters, Dec. 1997, vol. 18, No. 12, pp. 586-588.
Agarwal, A.K. et al., "1400 V 4H-SiC Power MOSFETs", Materials Science Forum, Published: 1998, vols. 264-268, pp. 989-992.
Agarwal, A.K. et al., "A Critical Look at the Performance Advantages and Limitations of 4H-SiC Power UMOSFET Structures", Proceedings of the International Symposium on Power Semiconductor Devices and IC's, Published: 1996, pp. 119-122.
Agarwal, A.K. et al., "Investigation of Lateral RESURF, 6H-SiC MOSFETs", Materials Science Forum, Published: 2000, vols. 338-342, pp. 1307-1310.
Agarwal, A.K. et al., "Temperature Dependence of Fowler-Nordheim Current in 6H- and 4H-SiC MOS Capacitors", IEEE Electron Device Letters, Dec. 1997, vol. 18, No. 12, pp. 592-594.
Alok, Dev. et al., "Process Dependence of Inversion Layer Mobility in 4H-SiC Devices", Silicon Carbide and Related Materials, Published: 1999, pp. 1077-1080.
Asano, K. et al., "Dynamic Characteristics of 6.2 kV High Voltage 4H-SiC pn Diode with Low Loss", Transactions of the Institute of Electrical Engineers of Japan, May 2003, vol. 123-D, No. 5, pp. 623-627.
Author Unknown, "Motorola Power MOSFET Transistor Databook", 4th Edition, Motorola, Inc., Copyright: 1998, pp. 254-257.
Author Unknown, "Figure 3", Compound Semiconductor.Net, Updated: May 2006, Retrieved: Jul. 7, 2006, http://www.compoundsemiconductor.net, 4 pages.
Author Unknown, "Insulated-Gate Bipolar Transistor", Wikipedia—The Free Encyclopedia, Updated in Jun. 11, 2010, Retrieved on Jun. 21, 2010, http://en.wikipedia.org/wiki/Insulated-gate_bipolar_transistor, 6 pages.
Author Unknown, "The Insulated Gate Biopolar Transistor (IGBT)", University of Glasgow, Updated: Feb. 14, 2007, Retrieved Jul. 7, 2006, http://www.elec.gla.ac.uk/groups/dev_mod/papers/igbt/igbt.html, 3 pages.
Ayalew, T., "4.4.3.1 MPS Diode Structure", Tu Wien. Jul. 6, 2006, http://www.iue.tuwien.ac.at/phd/ayalew/node88.html, 2 pages.
Baliga, B., "Chapter 7: Power Mosfet", Power Semiconductor Devices, Copyright: 1996, pp. 335-425, Boston, MA, PWS Publishing Company.
Baliga, B., "Chapter 8: Insulated Gate Bipolar Transistor", Power Semiconductor Devices, Copyright: 1996, pp. 426-502, Boston, MA, PWS Publishing Company.
Non-Final Office Action for U.S. Appl. No. 12/124,341, mailed Oct. 18, 2010, 7 pages.
Bhatnagar, Mohit et al., "Comparison of 6H-SiC, 3C-SiC, and Si for Power Devices", IEEE Transactions on Electron Devices, Mar. 1993, vol. 40, No. 3, pp. 645-655.
Buchner, R. et al., "Laser Recrystallization of Polysilicon for Improved Device Quality", Springer Proceedings in Physics, Copyright: 1989, vol. 55, pp. 289-294.
Capano, M.A. et al., "Ionization Energies and Electron Mobilities in Phosphorus- and Nitrogen-Implanted 4H Silicon Carbide", IEEE ICSCRM Conference 1999, Oct. 10-13, 1999, 4 pages.
Capano, M.A. et al., "Surface Roughening in Ion Implanted 4-H Silicon Carbide", Journal of Electronic Materials, Published: 1999, vol. 28, No. 3, pp. 214-218.
Casady, J.B. et al., "900 V DMOS and 1100 V UMOS 4H-SiC Power FETs", Northrop Grumman Science and Technology Center, Published: 1997, 2 Pages.
Chakraborty, Supratic et al., "Interface Properties of N2O-Annealed SiO2/SiC System", IEEE, Copyright: 2000, pp. 108-111.
Chang, K.C. et al., "Observation of a Non-Stoichiometric Layer at the Silicon Dioxide—Silicon Carbide Interface: Effect of Oxidation Temperature and Post-Oxidation Processing Conditions", Materials Research Social Symposium Procedures, Copyright: 2001, vol. 640, 6 pages.
Chen, Jia-Rong et al., "Theoretical Analysis of Current Crowding Effect in Metal/AlGaN/GaN Schottky Diodes and its Reduction by Using Polysilicon in Anode", Chinese Physics Letters, Jul. 2007, vol. 24, No. 7, pp. 2112-2114.
Cho, Won-Ju et al., "Improvement of Charge Trapping by Hydrogen Post-Oxidation Annealing in Gate Oxide of 4H-SiC metal-oxide-semiconductor capacitors", Applied Physical Letters, Aug. 21, 2000, vol. 77, No. 8, 1215-1217.
Chung, Gilyong et al., "Effects of Anneals in Ammonia on the Interface Trap Density Near the Band Edges in 4H-Silicon Carbide Metal-Oxide-Semiconductor Capacitors", Applied Physical Letters, Nov. 27, 2000, vol. 77, No. 22, pp. 3601-3603.
Chung, G.Y. et al., "The Effect of Si:C Source Ration on S1O2/SiC Interface State Density for Nitrogen Doped 4H and 6H SiC", Materials Science Form, Copyright: 2000, vol. 338-342, pp. 1097-1100.
Chung, G.Y. et al., "Effect of Nitric Oxide Annealing on the Interface Trap Densities Near the Band Edges in the 4H Polytype Silicon Carbide", Applied Physics Letters, Mar. 27, 2000, vol. 76, No. 13, pp. 1713-1715.
Chung, G.Y. et al., "Improved Inversion Channel Mobility for 4h-SiC MOSFETs Following High Temperature Anneals in Nitric Oxide", IEEE Electron Device Letters, Apr. 2001, vol. 22, No. 4, pp. 176-178.
Dahlquist, F. et al., "A 2.8kV, Forward Drop JBS Diode with Low Leakage", Materials Science Forum, Copyright: 2000, vols. 338-342, pp. 1179-1182.

(56) References Cited

OTHER PUBLICATIONS

Das, Mrinal K. et al., "A 13 kV 4H-SiC n-Channel IGBT with Low Rdiff on and Fast Switching", DARPA Contract, Published: 2007, 4 Pages.

Das, M.K. et al., "High Mobility 4H-SiC Inversion Mode MOSFETs Using Thermally Grown", No Annealed SiO2, IEEE 58th Device Research Conference, Jun. 19-21, 2000, 3 Pages.

Das, M.K. et al., "Inversion Channel Mobility in 4H- and 6H-SiC MOSFETs", School of Electrical and Computer Engineering at Purdue University, Published: 1998, 2 pages.

Das, Mrinal K., "Fundamental Studies of the Silicon Carbide MOS Structure", Thesis submitted to Purdue University for Doctorate of Philosophy Program, Dec. 1999, 160 Pages.

Dastidar, Sujoyita, "A Study of P-Type Activation in Silicon Carbide", Thesis submitted to Faculty of Purdue University, May 1998, 102 Pages.

De Meo, R.C. et al., "Thermal Oxidation of SiC in N2O", The Electrochemical Society, Inc., Nov. 1994, vol. 141, No. 11, pp. L150-L152.

Del Prado, A. et al., "Full Composition Range Silicon Oxynitride Films Deposited by ECR-PECVD at Room Temperature", Thin Solid Films, Published: 1999, vols. 343-344, pp. 437-440.

Dimitrijev, Sima et al., "Nitridation of Silicon-Dioxide Films Grown on 6H Silicon Carbide", IEEE Electron Device Letters, May 1997, vol. 18, No. 5, pp. 175-177.

Feldman, Leonard C. et al., "High Performance SiC Power Devices via Atomic Scale Engineering", 1999 DARPA/MTO High Power and ONR Power Switching Review, Aug. 10-12, 1999, 20 pages.

Fisher, C.A. et al., "The Performance of High-Voltage Field Relieved Schottky Barrier Diodes", IEE Proceedings, Dec. 1985, vol. 132, Pt. 1, No. 6, pp. 257-260.

Fukuda, Kenji et al., "Improvement of SiO2/4H-SiC Interface by Using High Temperature Hydrogen Annealing at 1000• C", External Abstracts of the 1998 International Conference on Solid State Devices and Materials, Published: 1998, pp. 100-101.

Fukuda, Kenji et al., "Improvement of SiO2/4H-SiC Interface Using High-Temperature Hydrogen Annealing at Low Pressure and Vacuum Annealing", Japanese Journal of Applied Physics, Copyright: 1999, vol. 38, pp. 2306-2309.

Final Office Action for U.S. Appl. No. 12/124,341, mailed Jun. 21, 2011, 8 pages.

Goh, W.L. et al., "Buried Metallic Layers in Silicon Using Wafer Fusion Bonding Techniques", Proceedings of the Mediterranean Electrotechnical Conference. Apr. 12, 1994, vol. 1, No. Conf. 7, pp. 625-628.

Hubel, Kerstin, "Hybrid Design Improves Diode Robustness and Boosts Efficiency", Compound Semiconductor.Net, Updated: May 2006, Retrieved: Jul. 7, 2006, http://www.compoundsemiconductor.net, 4 pages.

Hull, Brett A. et al., "Drift-Free 10-kV, 20-A 4H-SiC PiN Diodes", Journal of Electronic Materials, Published: 2005, vol. 34, No. 4, pp. 341-344.

Jamet, P. et al., "Physical Properties of N/sub 2/0 and No—Nitrided Fate Oxides Grown on 4H SiC", Applied Physics Letters, Jul. 2001, vol. 79, No. 3, pp. 323-325.

Restriction Requirement for U.S. Appl. No. 12/124,341, mailed Jul. 13, 2010, 6 pages.

Sze, S.M., "Chapter 5: Bipolar Transistor and Related Devices", Semiconductor Devices Physics and Technology, Copyright: 2002, p. 130, United States of America, John Wiley & Sons, Inc.

Kinoshita, Kozo et al., "Guard Ring Assisted RESURF: A New Termination Structure Providing Stable and High Breakdown Voltage for SiC Power Devices", IEEE, Copyright: 2002, pp. 253-256.

Kobayashi, K. et al., "Dielectric Breakdown and Current Conduction of Oxide/Nitride/Oxide Multi-Layer Structures", 1990 Symposium of VLSI Technology, Copyright: 1990, pp. 119-120.

Krishnaswami, Sumi et al., "High Temperature Characterization of 4H-SiC Bipolar Junction Transistors", Materials Science Forum, Jan. 1, 2009, vols. 527-529, pp. 1437-1440.

Lai, P.T. et al., "Effects of Nitridation and Annealing on Interface Properties of Thermally Oxidized SIO2/SiC Metal-Oxide-Semiconductor System", Applied Physics Letters, Jun. 19, 2000, vol. 75, No. 25, pp. 3744-3748.

Lai, P.T. et al., "Interface properties of N2O-Annealed NH3-Treated 6H-SiC MOS Capacitor", IEEE, Copyright: 1999, pp. 46-49.

Levinshtein, Michael E. et al., "On the Homogeneity of the Turn-On Process in High-Voltage 4H-SiC Thyristors", Solid-State Electronics, Published: 2005, vol. 49, pp. 233-237.

Li, Y. et al., "High-Voltage (3 kV) UMOSFETs in 4H-SiC", IEEE Transactions on Electron Devices, Jun. 2002, vol. 49, No. 6, pp. 972-975.

Li, H.F. et al., "Improving SiO2 Grown on P-Type 4H-SiC by NO Annealing", Materials Science Forum, Copyright: 1998, vol. 264-268, pp. 869-872.

Lipkin, Lori et al., "Challenges and State-of-the-Art of Oxides on SiC", Material Research Social Symposium Proceedings, Copyright: 2001, vol. 640, pp. 89-98.

Lipkin, Lori et al., "Insulator Investigation on SiC for Improved Reliability", IEEE Transactions on Electron Devices, Mar. 1999, vol. 46, No. 3, pp. 525-532.

Lipkin, L.A. et al., "Low Interfaces State Density Oxides on P-Type SiC", Materials Science Forum, Copyright: 1998, vols. 264-268, pp. 853-856.

Losee, P.A. et al., "High-Voltage 4H-SiC PiN Rectifiers with Single-Implant, Multi-Zone JTE Termination", Proceedings for 2004 International Symposium on Power Semiconductor Devices & ICs, Published: 2004, pp. 301-304.

Losse, P.A. et al., "Degraded Blocking Performance of 4H-SiC Rectifiers Under High dV/dt Conditions", Proceedings for 17th International Symposium on Power Semiconductor Devices & ICs, May 23-26, 2005, pp. 1-4.

Ma, Y. et al., "Fixed and Trapped Charges at Oxide-Nitride-Oxide Heterostructure Interfaces Formed by Remote Plasma Enhanced Chemical Vapor Deposition", American Vacuum Society, Copyright: 1993, vol. 11, No. 4, pp. 1533-1540.

Mondal, K. et al., "An Integrated 500-V Power DMOSFET/Antiparallel Rectifier Device with Improved Diode Reverse Recovery Characteristics", IEEE Electron Device Letters, Sep. 2002, vol. 23, No. 9, pp. 562-564.

Mutin, P. Hubert, "Control of the Composition and Structure of Silicon Oxycarbide and Oxynitride Glasses Derived from polysiloxane precursors", Journal of Sol-Gel Science and Technology, Copyright: 1999, pp. 27-38.

Myer-Ward, R.L. et al., "Turning of Basal Plane Dislocations During Epitaxial Growth on 4 Off-Axis 4h-SiC", 7th European Conference on Silicon Carbide and Related Materials, Sep. 7-11, 2008, retrieved Jul. 1, 2009, http://escrm08.com/invited_presentations.html, Barcelona, Spain, 2 pages.

Palmour, J.W. et al., "SiC Device Technology: Remaining Issues", Diamond and Related Materials, Published: 1997, vol. 5, pp. 1400-1404.

Palmour, John, "Silicon Carbide npnp Thyristors", NASA Tech Briefs. Updated: Dec. 1, 2000, Retrieved Sep. 2, 2010, http://www.techbriefs.com/component/content/article/7031, 3 pages.

Pankin, D. et al., "Electrical and Microstructural Properties of Highly Boron-Implantation Doped 6H-SiC", Journal of Applied Physics, Mar. 15, 2001, vol. 89, No. 6, pp. 3162-3167.

Pantelides, S.T. et al., "Atomic-Scale Engineering of the SiC-SiO2 Interface", Materials Science Forum, Copyright: 2000, vols. 338-342, pp. 1133-1136.

Patel, R. et al., "Phosphorus-Implanted High-Voltage N+P 4H-SiC Junction Rectifiers", Proceedings of 1998 International Symposium on Power Semiconductor Devices & Ics, Published: 1998, pp. 387-390.

Rao, Mulpuri V. et al., "P-N Junction Formation in 6H-SiC Acceptor Implantation into a N-Type Substrate", Nuclear Instructions and Mechanics in Physics Res., Published: 1995, vol. 106, pp. 333-338.

Rao, S. et al., "Silane Overpressure Post-Implant Annealing of Al Dopants in SiC: Cold Wall CVD Apparatus", Applied Surface Science, Published: 2006, vol. 252, pp. 3837-3842.

(56) References Cited

OTHER PUBLICATIONS

Rao, Mulpuri V., "Maturing Ion-Implantation Technology and its Device Applications in SiC", Solid State Electronics, Published: 2003, vol. 47, pp. 213-222.
Richmond, J.T. et al., "Hybrid 4H-SiC MOS Gated Transistor (MGT)", DARPA Contract #N00014-99-C-0377, Published: 2002, 6 pages.
Ryu, Sei-Hyung et al., "27 mΩ-cm2, 1.6 kV Power DiMOSFETs in 4H-SiC", Proceedings of the 14th International Symposium on Power Semiconductor Devices & ICs 2002, ISPSD '02 Proceedings, Jun. 4-7, 2002, pp. 65-68, Santa Fe, NM.
Schörner, Reinhold et al., "Rugged Power MOSFETs in 6H-SiC with Blocking Capability up to 1800V", Silicon Carbide and Related Materials, Copyright: 2000, vols. 338-342, pp. 1295-1298.
Schörner, Reinhold et al., "Significantly Improved Performance of MOSFET's on Silicon Carbide Using the 15R-SiC Polytype", IEEE Electron Device Letters, May 1999, vol. 20, No. 3, pp. 241-244.
Senzaki, Junji et al., "Effects of Pyrogenic Reoxidation Annealing on Inversion Channel Mobility of 4H-SiC Metal-Oxide-Semiconductor Field-effect Transistor Fabricated on (1120) Face", The Japanese Society of Applied Physics, Nov. 15, 2001, vol. 40, pp. 1201-1203.
Shenoy, Jayarama N. et al., "High-Voltage Double-Implanted Power MOSFET's in 6H-SiC", IEEE Electron Device Letters, Mar. 1997, vol. 18, No. 3, pp. 93-95.
Shenoy, Praveen M. et al., "The Planar 6H-SiC Accufet: A New High-Voltage Power MOSFET Structure", IEEE Electron Device Letters, Sep. 1999, vol. 18, No. 12, pp. 589-591.
Singh, R. et al., "Planar Terminations in 4H-SIC Schottky Diodes with Low Leakage and High Yields", ISPSD '97, Copyright: 1997, pp. 157-160.
Singh, R. et al., "High Temperature, High Current, 4H-SiC Accu-DMOSFET", Silicon Carbide and Related Materials, Published: 2000, vols. 338-342, pp. 1271-1274.
Sridevan, S. et al., "Lateral N-Channel Inversion Mode 4H-SiC MOSFET'S", IEEE Electron Devices Letters, Jul. 1998, vol. 19, No. 7, pp. 228-230.
Sridevan, S. et al., "On the Prescence of Aluminum in Thermally Grown Oxides on 6H-Silicon Carbide", IEEE Electron Devices Letters, Mar. 1996, vol. 17, No. 3, pp. 136-138.
Stein Von Kamienski, E.G. et al., "Long Term Stability of Gate-Oxides on N- and P-Type Silicon Carbide Studies by Charge Injection Techniques", Materials Science and Engineering, Published: 1997, vol. 46, pp. 263-266.
Stengl, R. et al., "Variation of Lateral Doping—A New Concept to Avoid High Voltage Breakdown of Planar Junctions", Science Research Laboratories, Jan. 12, 1985, 4 pages.
Stengl, R. et al., "Variation of Lateral Doping as a Field Terminator for High-Voltage Power Devices", IEEE Transactions on Electron Devices, Mar. 1986, vol. ED-33, No. 3, pp. 426-428.
Streetman, Ben G., "Chapter 7: Bipolar Junction Transistors", Solid State Electronic Devices, Copyright: 1980, pp. 228-284, Englewood Cliffs, NJ, Prentice-Hall, Inc.
Sugawara, Yoshitaka et al., "3.6 kV 4H-SiC JBS Diodes with Low RonS", Materials Science Forum: Silicon Carbide and Related Materials, Copyright: 2000, vol. 338-342, pp. 1183-1186.
Sundaresan, Siddarth G. et al., "Ultra-Low Resistivity Al+ Implanted 4H-SiC Obtained by Microwave Annealing and a Protective Graphite Cap", Solid-State Electronics 52, Published: 2008, pp. 140-145.
Suvorov, A.V. et al., "4H-Sic Self-Aligned Implant-Diffused Structure for Power DMOSFETs", Materials Science Forum, Copyright: 2000, vols. 338-342, pp. 1275-1278.
Suzuki, Seiji et al., "Effect of Post-Oxidation-Annealing in Hydrogen on SiO2/4H-SiC Interface", Materials Science Forums, Copyright: 2000, vols. 338-342, pp. 1073-1076.
Sze, S.M., "Si-SiO2 MOS Diode", Physics of Semiconductor Devices, 2nd Edition, Copyright: 1981, pp. 383-390, Korea, John Wiley & Sons, Inc.
Baliga, B.J., "The Pinch Rectifier: A Low-Forward-Drop High-Speed Power Diode," IEEE Electron Device Letters, vol. EDL-5, No. 6, Jun. 1984, 3 pages.
Notice of Allowance for U.S. Appl. No. 13/229,750 mailed Jan. 31, 2013, 7 pages.
Non-final Office Action for U.S. Appl. No. 13/229,752 mailed Mar. 21, 2013, 17 pages.
Unknown, "Data Book for Metals" published as early as Mar. 19, 2009, pp. 194.
Itoh, "Analysis of Schottky Barrier Heights of Metal/SiC Contacts and Its Possible Application to High-Voltage Rectifying Devices," Phys. Stat. Sol. (A), vol. 162, Jul. 1997, pp. 225-245.
Itoh, "Excellent Reverse Blocking Characteristics of High-Voltage 4H-SiC Schottky Rectifiers with Boron-Implanted Edge Termination," IEEE Electron Device Letters, vol. 17, No. 3, Mar. 1996, pp. 139-141.
Karlsteen et al., "Electrical properties of inhomogeneous SiC Mis structures," Journal of Electronic Materials, vol. 24, No. 7, Jul. 1995, pp. 853-861.
Matsunami, "Step-controlled Epitaxial Growth of SiC: High Quality Homoepitaxy," Materials Science and Engineering, vol. B20, Aug. 1997, pp. 125-166.
Mohammad, "Near Ideal Plantinum-GaN Schottky Diodes," Electronic Letters, Mar. 14, 1996, vol. 32, No. 6, pp. 598-599.
Rao, "Al and N Ion Implantations in 6H-SiC," Inst. Phys. Conf. Ser. No. 142, Chapter 3, 1996, pp. 521-524.
Wang, "High Barrier Heigh GaN Schottky Diodes: Pt/GaN and Pd/GaN," Applied Phys. Letters, vol. 68, No. 9, Feb. 26, 1996, pp. 1267-1269.
Wilamoski, "Schottky Diodes with High Breakdown Voltages," Solid-State Electronics, vol. 26, No. 5, May 1983, pp. 491-493.
International Search Report and Written Opinion for PCT/US2012/054091 mailed Dec. 5, 2012, 12 pages.
International Search Report and Written Opinion for PCT/US2012/054092 mailed Dec. 5, 2012, 12 pages.
International Search Report and Written Opinion for PCT/US2012/054093 mailed Dec. 5, 2012, 12 pages.
Non-final Office Action for U.S. Appl. No. 13/229,750 mailed Oct. 2, 2012, 15 pages.
Tan, J. et al., "High-Voltage Accumulation-Layer UMOSFET's in 4H-SiC", IEEE Electron Device Letters, Sep. 1998, vol. 49, No. 12, pp. 487-489.
Thomas, Chris et al., "Annealing of Ion Implantation Damage in SiC Using a Graphite Mask", Materials Research Society Symposium Proc., Copyright: 1999, vol. 572, pp. 45-50.
Tobin, Philip et al., "Furnace Formation of Silicon Oxynitride Thin Dielectrics in Nitrous Oxide N2O: The Role of Nitric Oxide (NO)", Junior Applied Physics, Feb. 1, 1994, vol. 75, No. 3, pp. 1811-1817.
Torvik, John T. et al., "Electrical Characterization of GaN/SiC n-p Heterojunction Diodes", Applied Physics Letters, Published: 1998, vol. 72, pp. 1371-1373.
Treu, M. et al., "A Surge Current Stable and Avalanche Rugged SiC Merged pn Schottky Diode Blocking 600V Especially Suited for PFC Applications", Materials Science Forum: Silicon Carbide and Related Materials, Copyright: 2005, vol. 527-539, pp. 1155-1158.
Ueno, Katsunori et al., "The Guard-Ring Termination for High-Voltage SiC Schottky Barrier Diodes", IEEE Electron Device Letters, Jul. 1995, vol. 16, No. 7, pp. 331-332.
Ueno, Katsunori et al., "4H-SiC MOSFET's Utilizing the H2 Surface Cleaning Technique", IEEE Electron Device Letters, Jul. 1998, vol. 19, No. 7, pp. 244-246.
Ueno, Katsunori et al., "Counter-Doped MOSFET's of 4H-SiC", IEEE Electron Device Letters, Dec. 1999, vol. 20, No. 12, pp. 624-626.
Vassilveski, K. et al., "High Voltage Silicon Carbide Schottky Diodes with Single Zone Junction Termination Extension", Materials Science Forum, Copyright: 2007, pp. 873-876, Switzerland, Trans Tech Publications.
Vassilveski, K.V. et al., "Protection of Selectively Implanted and Patterned Silicon Carbide Surfaces with Graphite Capping Layer During Post-Implantation Annealing", Semiconductor Science and Technology, Feb. 3, 2005, pp. 271-278, Switzerland, Trans Tech Publications.

(56) References Cited

OTHER PUBLICATIONS

Vathulya, Vickram et al., "A Novel 6H-SiC Power DMOSFET with Implanted P-Well Spacer", IEEE Electron Device Letters, Jul. 1999, vol. 20, No. 7, pp. 354-356.

Vathulya, Vickram et al., "Characterization of Channel Mobility of Implanted SiC to Determine Polytype Suitability for the Power DIMOS Structure", Powerpoint Presentation at Lehigh University, Presented 2000, 26 total slides, 13 pages.

Wang, Xiewen W. et al., "High Temperature Characteristics of High-Quality SiC MIS Capacitors with O/N/O Gate Dielectric", IEEE Transactions on Electron Devices, Feb. 2000, vol. 47, No. 2, pp. 450-462.

Wang, Y. et al., "Accumulation-Mode SiC Power MOSFET Design Issues", Material Science Forum, Feb. 2000, vols. 338-342, pp. 1287-1290.

Williams, J.R. et al., "Passivation of the 4H-SiC/SiO2 Interface with Nitric Oxide", Materials Science Forum, Copyright: 2002, vols. 389-393, pp. 967-972.

Xu, J.P. et al., "Improved Performance and Reliability of N20-Grown Oxynitride on 6H-SiC", IEEE Electron Device Letters, Jun. 2000, vol. 21, No. 6, pp. 298-300.

Yilmaz, Hamza, "Optimization and Surface Charge Sensitivity of High Voltage Blocking Structures with Shallow Junctions", IEEE Transactions on Electron Devices, Jul. 1991, vol. 38, No. 7, pp. 1666-1675.

Zhang, Qingchun et al., "A 10-K Monolithic Darlington Transistor with βforced of 336 in 4H-SiC", Feb. 2009, IEEE Electron Device Letters, Feb. 2009, vol. 30, No. 2, pp. 142-144.

Zhang, Qingchun et al., "12 Kv 4H-SiC p-IGBTs with Record Low Specific On-Resistance", Materials Science Forum, Published: 2007, vols. 600-603, 4 pages.

Zhang, Qingchun et al., "Design and Fabrications of High Voltage IGBTs on 4H-SiC", Power semiconductor devices and IC's, 2006 IEEE International Symposium, Jun. 4-8, 2006, 4 pages.

Non-Final Office Action for U.S. Appl. No. 12/719,412, mailed Jan. 7, 2013, 20 pages.

Notice of Allowance for U.S. Appl. No. 13/229,750, mailed May 14, 2013, 8 pages.

China Patent Office Action for Chinese Patent Application No. 2007800294605, mailed Jan. 22, 2010, 7 pages.

European Search Report for European Patent Application No. 07112298.0, mailed Jan. 16, 2012, 7 pages.

European Search Report for European Patent Application No. 09177558.5, mailed Feb. 22, 2010, 6 pages.

European Search Report for European Patent Application No. 07120038.0, mailed Jun. 16, 2008, 7 pages.

European Search Report for European Patent Application No. 09163424.6, mailed Apr. 9, 2010, 10 pages.

Extended European Search Report for European Patent Application No. 07112298.0, mailed Feb. 18, 2009, 12 pages.

International Preliminary Report on Patentability for International Application No. PCT/US2010/035709, mailed on Dec. 15, 2011, 8 pages.

International Preliminary Report on Patentability for International Application No. PCT/US2010/035713, mailed on Dec. 15, 2011, 8 pages.

International Preliminary Report on Patentability for International Application No. PCT/US2011/031150, mailed on Oct. 26, 2012, 8 pages.

International Search Report for International Patent Application No. PCT/US/01/30715 mailed Jun. 5, 2002, 9 pages.

International Search Report for International Patent Application No. PCT/US/01/42414, mailed Apr. 23, 2002, 10 pages.

International Search Report for International Patent Application No. PCT/US/02/11691, mailed Dec. 17, 2002, 9 pages.

International Search Report for International Patent Application No. PCT/US2004/004982 mailed Jul. 22, 2004, 13 pages.

International Search Report for International Patent Application No. PCT/US2011/027383, mailed May 20, 2011, 8 pages.

International Search Report for International Patent Application No. PCT/US2010/025053, mailed Jul. 2, 2010, 18 pages.

International Search Report for US Patent Application No. 2007/0014139, mailed Feb. 4, 2008, 15 pages.

International Search Report for US Patent Application No. 2008/0008574, mailed Sep. 26, 2008, 15 pages.

International Search Report for US Patent Application No. 2008/0010538, mailed Dec. 22, 2008, 13 pages.

International Search Report for US Patent Application No. 2009/0000734, mailed Apr. 23, 2009, 13 pages.

International Search Report for US Patent Application No. 2009/0003089, mailed Aug. 20, 2009, 16 pages.

International Search Report for US Patent Application No. 2009/0065251, mailed Jun. 1, 2010, 14 pages.

International Search Report for US Patent Application No. 2010/0020071, mailed Mar. 26, 2010, 14 pages.

Non-Final Office Action for U.S. Appl. No. 12/719,412, mailed Dec. 12, 2013, 7 pages.

Notice of Allowance for U.S. Appl. No. 13/229,752, mailed Jan. 13, 2014, 5 pages.

* cited by examiner

SCHOTTKY DIODE

CROSS REFERENCE TO RELATED APPLICATIONS

The present application is related to U.S. utility patent application Ser. No. 13/229,750, entitled "EDGE TERMINATION STRUCTURE EMPLOYING RECESSES FOR EDGE TERMINATION ELEMENTS," now U.S. Pat. No. 8,618,582, filed concurrently herewith; and to U.S. utility patent application Ser. No. 13/229,752, entitled "SCHOTTKY DIODE EMPLOYING RECESSES FOR ELEMENTS OF JUNCTION BARRIER ARRAY," filed concurrently herewith, the disclosures of which are incorporated herein by reference in their entireties.

FIELD OF THE DISCLOSURE

The present disclosure relates to semiconductor devices.

BACKGROUND

A Schottky diode takes advantage of the metal-semiconductor junction, which provides a Schottky barrier and is created between a metal layer and a doped semiconductor layer. For a Schottky diode with an N-type semiconductor layer, the metal layer acts as the anode, and the N-type semiconductor layer acts as the cathode. In general, the Schottky diode acts like a traditional p-n diode by readily passing current in the forward-biased direction and blocking current in the reverse-biased direction. The Schottky barrier provided at the metal-semiconductor junction provides two unique advantages over p-n diodes. First, the Schottky barrier is associated with a lower barrier height, which correlates to lower forward voltage drops. As such, a smaller forward voltage is required to turn on the device and allow current to flow in a forward-biased direction. Second, the Schottky barrier generally has less capacitance than a comparable p-n diode. The lower capacitance translates to higher switching speeds than p-n diodes. Schottky diodes are majority carrier devices and do not exhibit minority carrier behavior which results in switching losses.

Unfortunately, Schottky diodes have traditionally suffered from relatively low reverse-biased voltage ratings and high reverse-biased leakage currents. In recent years, Cree, Inc. of Durham, N.C., has introduced a series of Schottky diodes that are formed from silicon carbide substrates and epitaxial layers. These devices have and continue to advance the state of the-art by increasing the reverse-biased voltage ratings, lowering reverse-biased leakage currents, and increasing forward-biased current handling. However, there remains a need to further improve Schottky device performance as well as reduce the cost of these devices.

SUMMARY

The present disclosure generally relates to a Schottky diode that has a substrate, a drift layer provided over the substrate, and a Schottky layer provided over an active region of the drift layer. The metal for the Schottky layer and the semiconductor material for the drift layer are selected to provide a low barrier height Schottky junction between the drift layer and the Schottky layer.

In one embodiment, the Schottky layer is formed of Tantalum (Ta) and the drift layer is formed of silicon carbide. As such, the barrier height of the Schottky junction may be less than 0.9 electron volts. Other materials are suitable for forming the Schottky layer and the drift layer.

In another embodiment, the drift layer has a first surface associated with the active region and provides an edge termination region. The edge termination region is substantially laterally adjacent the active region, and in certain embodiments, may completely or substantially surround the active region. The drift layer is doped with a doping material of a first conductivity type, and the edge termination region may include an edge termination recess that extends into the drift layer from the first surface. An edge termination structure, such as several concentric guard rings, may be formed in the bottom surface of the edge termination recess. A doped well may be formed in the drift layer at the bottom of the edge termination recess.

In another embodiment, the substrate is relatively thick, as the upper epitaxial structure, including the drift layer and the Schottky layer, are formed on a top surface of the substrate. After all or at least a portion of the upper epitaxial structure is formed, the bottom portion of the substrate is removed to effectively "thin" the substrate. As such, the resulting Schottky diode has a thinned substrate wherein a cathode contact may be formed on the bottom of the thinned substrate. The anode contact is formed over the Schottky layer.

In yet other embodiments, a junction barrier array may be provided in the drift region just below the Schottky layer and a mesa guard ring may be provided in the drift layer about all or a portion of the active area. The elements of the junction barrier array, the guard rings, and the mesa guard ring are generally doped regions in the drift layer. To increase the depth of these doped regions, individual recesses may be formed in the surface of the drift layer where the elements of the junction barrier array, the guard rings, and the mesa guard ring are to be formed. Once the recesses are formed in the drift layer, these areas about and at the bottom of the recesses are doped to form the respective elements of the junction barrier array, the guard rings, and the mesa guard ring.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
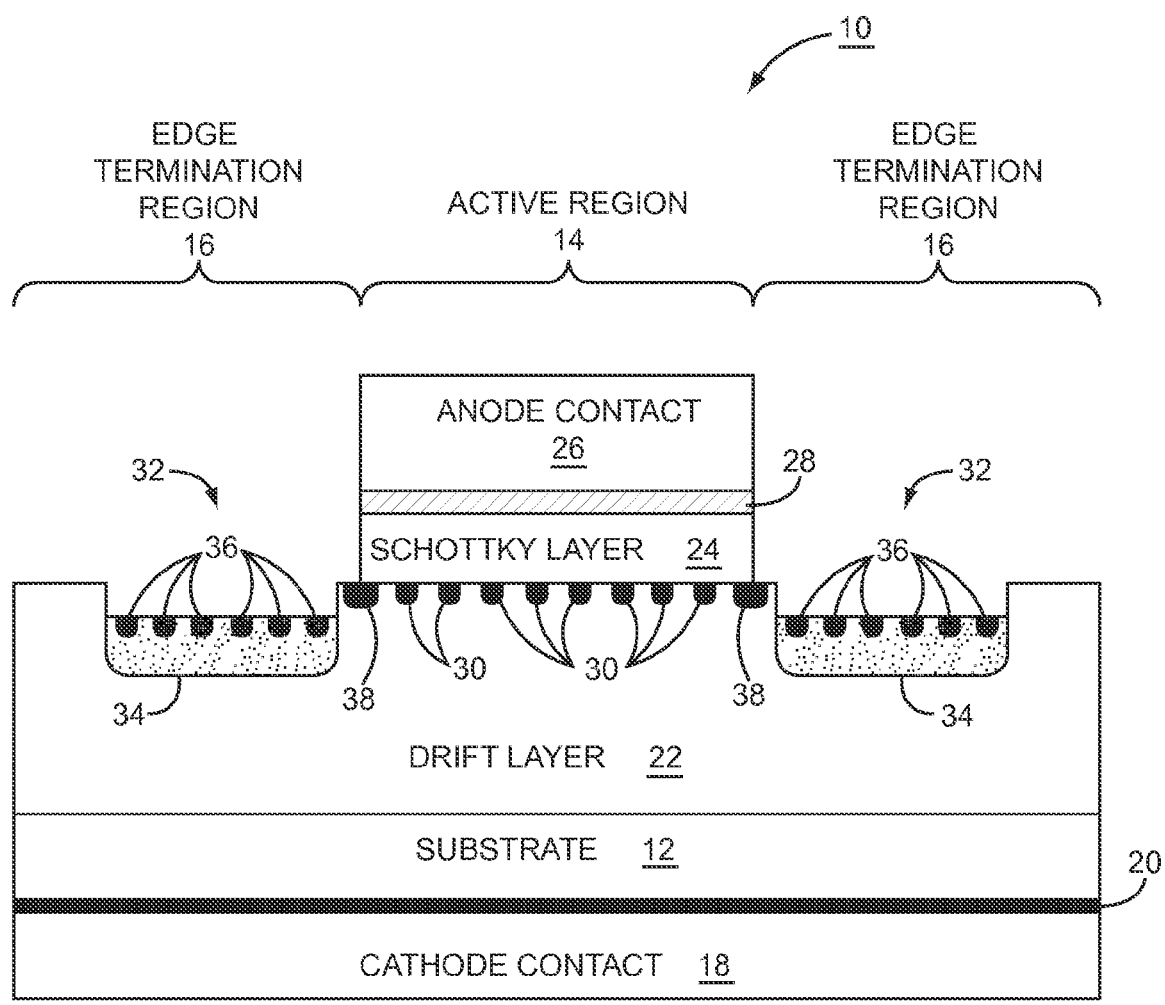
FIG. 1 is a cross-sectional view of a Schottky diode according to one embodiment of the disclosure.

Initially, an overview of the overall structure of an exemplary Schottky diode 10 is provided in association with FIG. 1. Details of the various structural and functional aspects of the Schottky diode 10 as well as an exemplary process for fabrication the Schottky diode 10 of FIG. 1 follow the structural overview. Notably, the embodiments described herein reference various semiconductor layers or elements therein as being doped with an N-type or P-type doping material. Being doped with an N-type or P-type material indicates that the layer or element has either an N-type or P-type conductivity, respectively. N-type material has a majority equilibrium concentration of negatively charged electrons, and P-type material has a majority equilibrium concentration of positively charged holes. The doping concentrations for the various layers or elements may be defined as being lightly, normally, or heavily doped. These terms are relative terms intended to relate doping concentrations for one layer or element to another layer or element.

Further, the following description focuses on an N-type substrate and drift layer being used in a Schottky diode; however, the concepts provided herein equally apply to Schottky diodes with P-type substrates and drift layers. As such, the doping charge for each layer or element in the disclosed embodiments may be reversed to create Schottky diodes with P-type substrates and drift layers. Further, any of the layers described herein may be formed from one or more epitaxial layers using any available technique, and additional layers that are not described may be added between those described herein without necessarily departing from the concepts of the disclosure.

As illustrated, the Schottky diode 10 is formed on a substrate 12 and has an active region 14 that resides within an edge termination region 16 that may, but does not need to, completely or substantially surround the active region 14. Along the bottom side of the substrate 12, a cathode contact 18 is formed and may extend below both the active region 14 and the edge termination region 16. A cathode ohmic layer 20 may be provided between the substrate 12 and the cathode contact 18 to facilitate a low impedance coupling therebetween. A drift layer 22 extends along the top side of the substrate 12. The drift layer 22, the cathode contact 18, and the cathode ohmic layer 20 may extend along both the active region 14 and the edge termination region 16.

In the active region 14, a Schottky layer 24 resides over the top surface of the drift layer 22, and an anode contact 26 resides over the Schottky layer 24. As depicted, a barrier layer 28 may be provided between the Schottky layer 24 and the anode contact 26 to prevent materials from one of the Schottky layer 24 and the anode contact 26 from diffusing into the other. Notably, the active region 14 substantially corresponds to the region where the Schottky layer 24 of the Schottky diode 10 resides over the drift layer 22. For purposes of illustration only, assume the substrate 12 and the drift layer 22 are silicon carbide (SiC). Other materials for these and other layers are discussed further below.

In the illustrated embodiment, the substrate 12 is heavily doped and the drift layer 22 is relatively lightly doped with an N-type material. The drift layer 22 may be substantially uniformly doped or doped in a graded fashion. For example, doping concentrations of the drift layer 22 may transition from being relatively more heavily doped near the substrate 12 to being more lightly doped near the top surface of the drift layer 22 that is proximate the Schottky layer 24. Doping details are provided further below.

Figure 2:
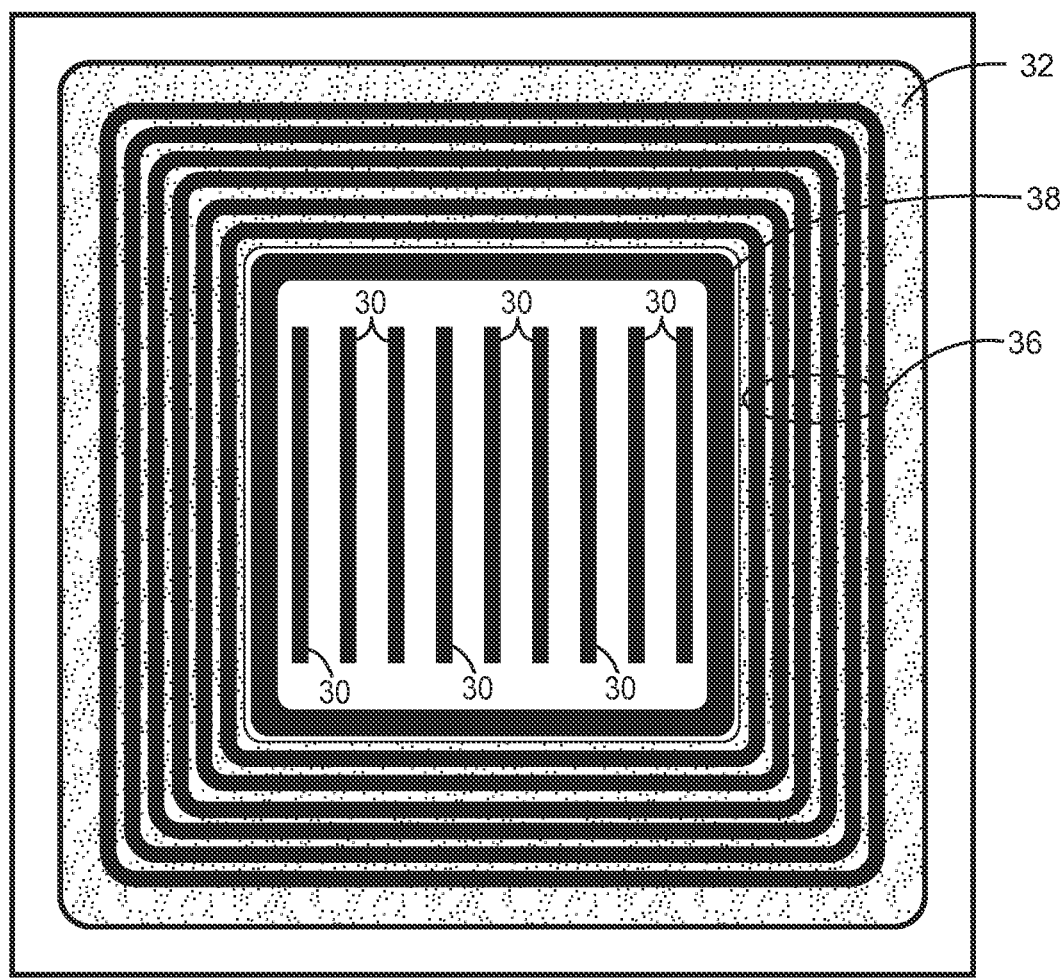
FIG. 2 is a top view of a Schottky diode, without the Schottky layer and anode contact, according to one embodiment of the disclosure.
Figure 3:
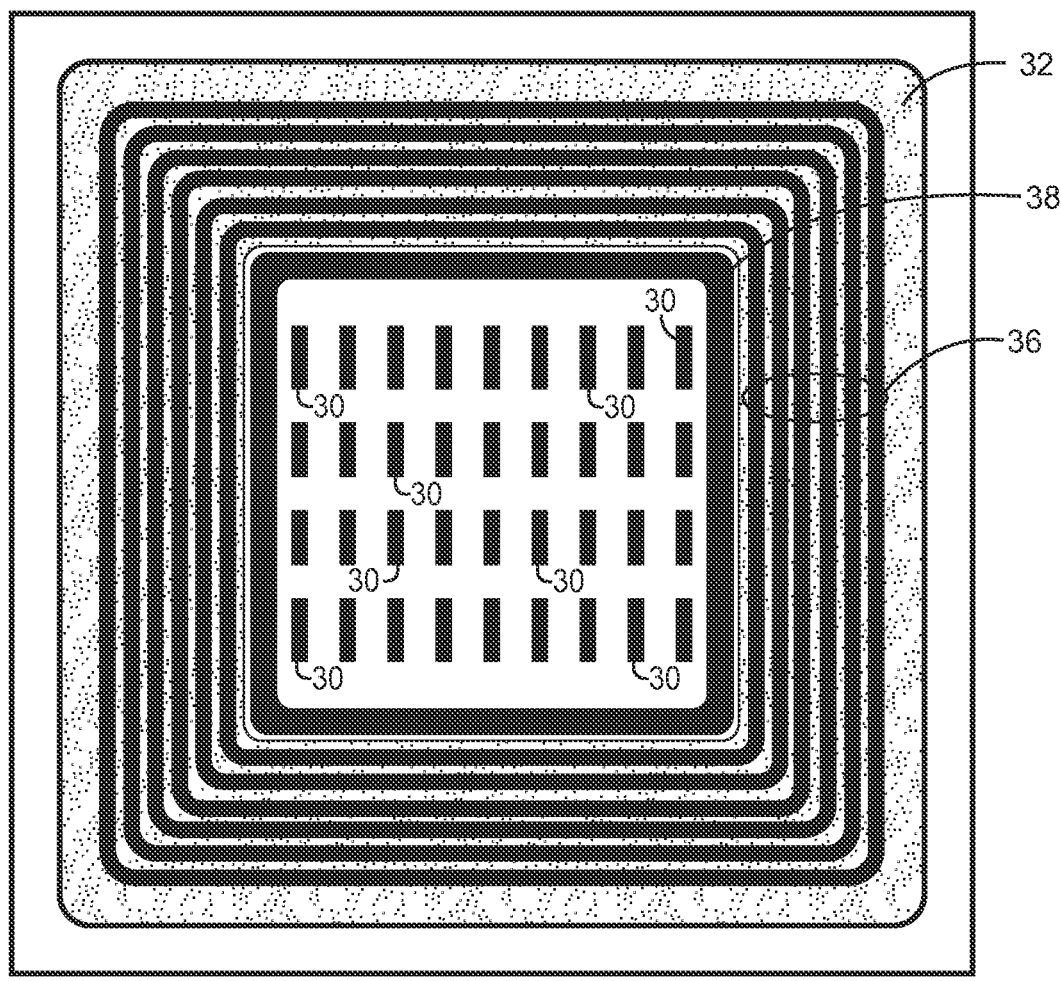
FIG. 3 is a top view of a Schottky diode, without the Schottky layer and anode contact, according to a second embodiment of the disclosure.
Figure 4:
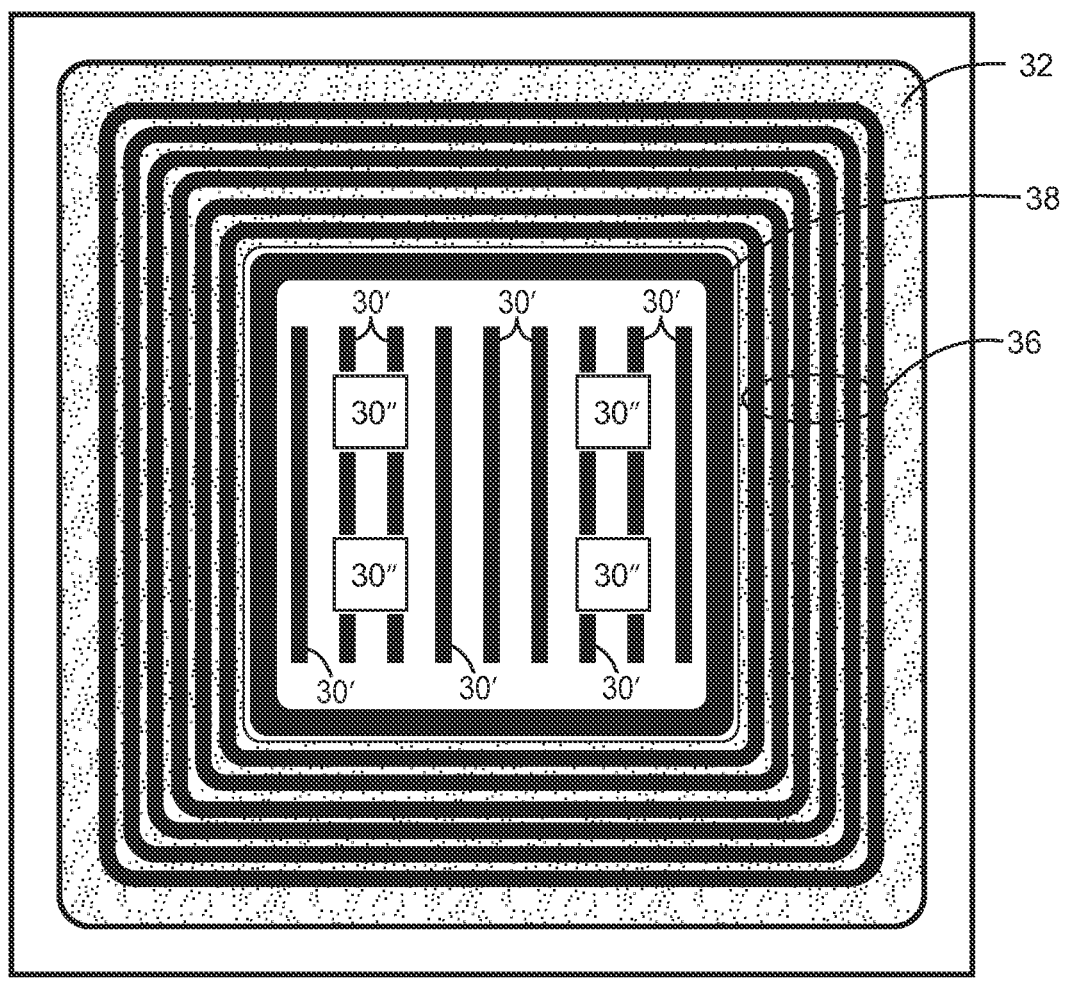
FIG. 4 is a top view of a Schottky diode, without the Schottky layer and anode contact, according to a third embodiment of the disclosure.
Figure 5:
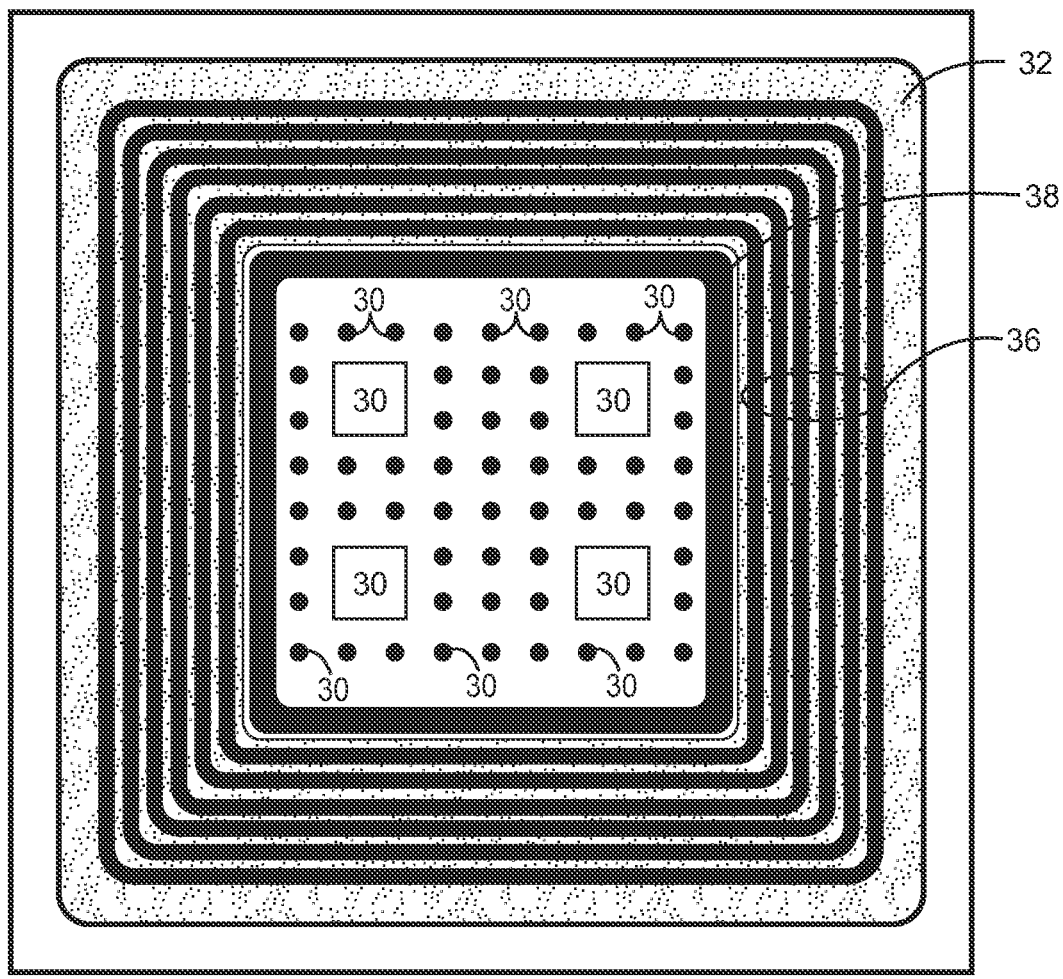
FIG. 5 is a top view of a Schottky diode, without the Schottky layer and anode contact, according to a fourth embodiment of the disclosure.

Beneath the Schottky layer 24, a plurality of junction-barrier (JB) elements 30 are provided along the top surface of the drift layer 22. Doping select regions in the drift layer 22 with P-type material forms these JB elements 30. As such, each JB element 30 extends from the top surface of the drift layer 22 into the drift layer 22. Together, the JB elements 30 form a JB array. The JB elements 30 may take on various shapes, as illustrated in FIGS. 2 through 5. As illustrated in FIG. 2, each JB element 30 is a single, long, elongated stripe that extends substantially across the active region 14, wherein the JB array is a plurality of parallel JB elements 30. In FIG. 3, each JB element 30 is a short, elongated dash wherein the JB array has parallel rows dashes of multiple dashes that are linearly aligned to extend across the active region 14. In FIG. 4, the JB elements 30 include a plurality of elongated stripes (30') and a plurality of islands (30"). As described further below, the elongated stripes and the islands may have substantially the same or substantially different doping concentrations. In FIG. 5, the JB elements 30 include an array of smaller, circular islands with a plurality of larger, rectangular islands dispersed evenly with the array of smaller, circular islands. Other shapes and configurations of the JB elements 30 and the ultimate JB array that is formed therefrom will be appreciated by those skilled in the art after reading the disclosure provide herein.

With continued reference to FIG. 1 in association with FIGS. 2 through 5, the edge termination region 16 includes a recessed channel that is formed in the top surface of the drift layer 22 and substantially surrounds the active region 14. This recessed channel is referred to as the edge termination recess 32. The presence of the edge termination recess 32 provides a mesa, which is surrounded by the edge termination recess 32 in the drift layer 22. In select embodiments, the distance between the surface of the edge termination recess 32 and the bottom surface of the mesa is between about 0.2 and 0.5 microns and perhaps about 0.3 microns.

At least one recess well 34 is formed in a portion of the drift layer 22 that resides below the bottom surface of the edge termination recess 32. The recess well 34 is formed by lightly doping a portion of the drift layer 22 that resides below the bottom surface of the edge termination recess 32 with a P-type material. As such, the recess well 34 is a lightly doped P-type region within the drift layer 22. Along the bottom surface of the edge termination recess 32 and within the recess well 34, a plurality of concentric guard rings 36 are formed. The guard rings 36 are formed by heavily doping the corresponding portions of the recess well 34 with a P-type doping material. In select embodiments, the guard rings are spaced apart from one another and extend into the recess well 34 from the bottom surface of the edge termination recess 32.

In addition to the guard rings 36 that reside in the edge termination recess 32, a mesa guard ring 38 may be provided around the outer periphery of the mesa that is formed by the edge termination recess 32. The mesa guard ring 38 is formed by heavily doping the outer portion of the top surface of the mesa with a P-type material, such that the mesa guard ring 38 is formed about the periphery of the active region 14 and extends into the mesa. While illustrated as substantially rectangular in FIGS. 2 through 5, the edge termination recess 32, the guard rings 36, and the mesa guard ring 38 may be of any shape and will generally correspond to the shape of the periphery of the active region 14, which is rectangular in the illustrated embodiments. Each of these three elements may provide a continuous or broken (i.e. dashed, dotted, or the like) loop about the active region 14.

Figure 6:
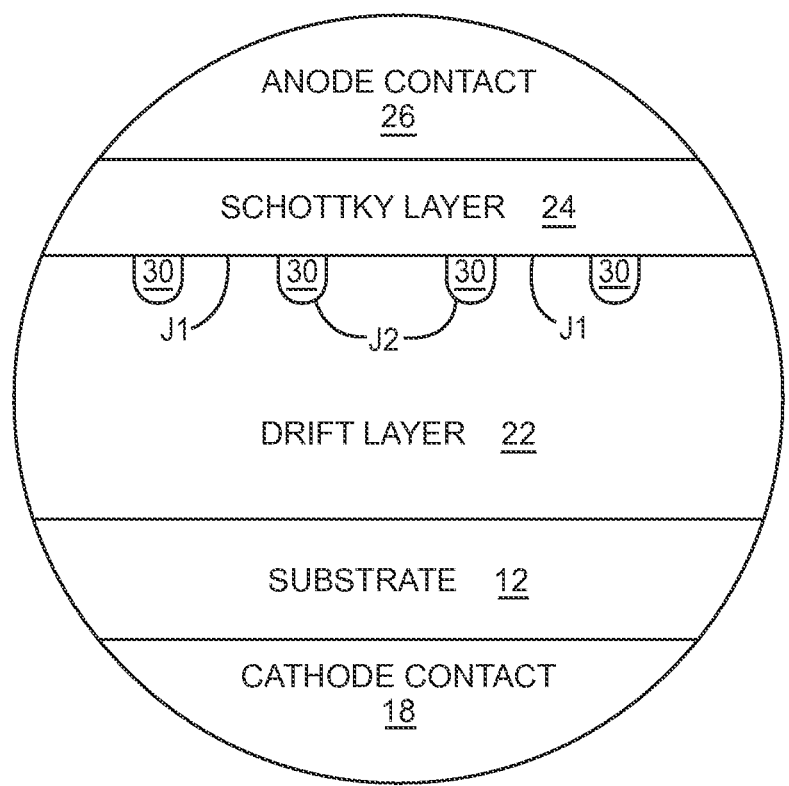
FIG. 6 is a partial cross-sectional view of a Schottky diode with a uniform JB array according to one embodiment of the disclosure.

In a first embodiment, FIG. 6 provides an enlarged view of a portion of the active region 14 and is used to help identify the various p-n junctions that come into play during operation of the Schottky diode 10. For this embodiment, assume the JB elements are elongated stripes (as illustrated in FIG. 2). With the presence of the JB elements 30, there are at least two types of junctions about the active region 14. The first is referred to as a Schottky junction J1, and is any metal-semiconductor (m-s) junction between the Schottky layer 24 and those portions of the top surface of the drift layer 22 that do not have a JB element 30. In other words, the Schottky junction J1 is a junction between the Schottky layer 24 and the those portions of the top surface of the drift layer that are between two adjacent JB elements 30 or a JB element 30 and the mesa guard ring 38 (not shown). The second is referred to as a JB junction J2, and is any p-n junction between a JB element 30 and the drift layer 22.

As the Schottky diode 10 is forward-biased, the Schottky junctions J1 turn on before the JB junctions J2 turn on. At low forward voltages, current transport in the Schottky diode 10 is dominated by majority carriers (electrons) injected across the Schottky junction J1. As such, the Schottky diode 10 acts like a traditional Schottky diode. In this configuration, there is little or no minority carrier injection, and thus no minority charge. As a result the Schottky diode 10 is capable of fast switching speeds at normal operating voltages.

When the Schottky diode 10 is reverse-biased, depletion regions that form adjacent the JB junctions J2 expand to block reverse current through the Schottky diode 10. As a result, the expanded depletion regions function to both protect the Schottky junction J1 and limit reverse leakage current in the Schottky diode 10. With the JB elements 30, the Schottky diode 10 behaves like a PIN diode.

Figure 7:
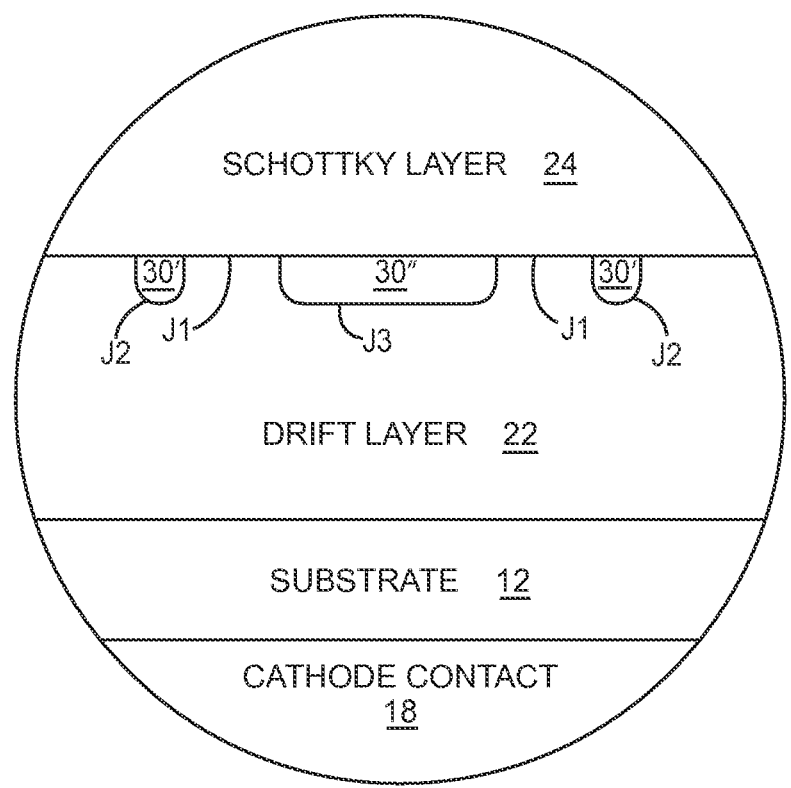
FIG. 7 is a partial cross-sectional view of a Schottky diode with a non-uniform JB array according to another embodiment of the disclosure.

In another embodiment, FIG. 7 provides an enlarged view of a portion of the active region 14 and is used to help identify the various p-n junctions that come into play during operation of the Schottky diode 10. For this embodiment, assume that there are two types of JB elements 30: the striped, lower-doped JB elements 30' and island-shaped, higher doped JB elements 30" (as illustrated in FIG. 4). Again, the Schottky junction J1 is any metal-semiconductor junction between the Schottky layer 24 and the those portions of the top surface of the drift layer that are between two adjacent JB elements 30 or a JB element 30 and the mesa guard ring 38 (not shown). The primary JB junction J2 is any p-n junction between a stripe JB element 30' and the drift layer 22. A secondary JB junction J3 is any p-n junction between an island JB element 30" and the drift layer 22. In this embodiment, assume that the stripe JB elements 30' are doped with a P-type material at a concentration that is the same or lower than the island JB elements 30".

The ratio of the surface area of the active region 14 of the Schottky diode 10 occupied by the lower-doped JB elements 30' and the higher-doped JB elements 30" to the total surface area of the active region 14 may affect both the reverse leakage current and the forward voltage drop of the Schottky diode 10. For example, if the area occupied by lower- and higher-doped JB elements 30', 30" is increased relative to the total area of the active region 14, the reverse leakage current may be reduced, but the forward voltage drop of the Schottky diode 10 may increase. Thus, the selection of the ratio of the surface area of the active region 14 occupied by the lower- and higher-doped JB elements 30' and 30" may entail a trade-off between reverse leakage current and forward voltage drop. In some embodiments, the ratio of the surface area of the active region 14 occupied by the lower- and higher-doped JB elements 30', 30" to the total surface area of the active region 14 may be between about 2% and 40%.

As the Schottky diode 10 is forward biased past a first threshold, the Schottky junction J1 turns on before the primary JB junctions J2 and the secondary JB junctions J3, and the Schottky diode 10 exhibits traditional Schottky diode behavior at low forward-biased voltages. At low forward-biased voltages, the operation of the Schottky diode 10 is dominated by the injection of majority carriers across the Schottky junctions J1. Due to the absence of minority carrier injection under normal operating conditions, the Schottky diode 10 may have very fast switching capability, which is characteristic of Schottky diodes in general.

As indicated, the turn-on voltage for the Schottky junctions J1 is lower than the turn-on voltage for the primary and secondary JB Junctions J2, J3. The lower- and higher-doped JB elements 30', 30" may be designed such that the secondary JB junctions J3 will begin to conduct if the forward-biased voltage continues to increase past a second threshold. If the forward biased voltage increases past the second threshold, such as in the case of a current surge through the Schottky diode 10, the secondary JB junctions J3 will begin to conduct. Once the secondary JB junctions J3 begin to conduct, the operation of the Schottky diode 10 is dominated by the injection and recombination of minority carriers across the secondary junction J3. In this case, the on-resistance of the Schottky diode 10 may decrease, which in turn may decrease the amount of power dissipated by the Schottky diode 10 for a given level of current and may help prevent thermal runaway.

Under reverse bias conditions, the depletion regions formed by the primary and secondary JB junctions J2 and J3 may expand to block reverse current through the Schottky diode 10, thereby protecting the Schottky junction J1 and limiting reverse leakage current in the Schottky diode 10. Again, when reverse-biased, the Schottky diode 10 may function substantially like a PIN diode.

Notably, the voltage blocking ability of the Schottky diode 10 according to some embodiments of the invention is determined by the thickness and doping of the lower-doped JB elements 30'. When a sufficiently large reverse voltage is applied to the Schottky diode 10, the depletion regions in the lower-doped JB elements 30' will punch through to the depletion region associated with the drift layer 22. As a result, a large reverse current is permitted to flow through the Schottky diode 10. As the lower-doped JB elements 30' are distributed across the active region 14, this reverse breakdown may be uniformly distributed and controlled such that it does not damage the Schottky diode 10. In essence, the breakdown of the Schottky diode 10 is localized to a punch-through of the lower doped JB elements 30', which results in a breakdown current that is distributed evenly across the active region 14. As a result, the breakdown characteristic of the Schottky diode 10 may be controlled such that large reverse currents can be dissipated without damaging or destroying the Schottky diode 10. In some embodiments, the doping of the lower doped JB elements 30' may be chosen such that the punch-through voltage is slightly less than the maximum reverse voltage that may otherwise be supported by the edge termination of the Schottky diode 10.

The design of the edge termination region 16 shown in FIG. 1 further enhances both the forward and reverse current and voltage characteristics of the Schottky diode 10. Notably, electric fields tend to build about the periphery of the Schottky layer 24, especially as the reverse voltage increases. As the electric fields increase, the reverse leakage current increases, the reverse breakdown voltage decreases, and the ability to control the avalanche current when the breakdown voltage is exceeded is decreased. Each of these characteristics runs counter to the need to provide a Schottky diode 10 that has low reverse leakage currents, high reverse breakdown voltages, and controlled avalanche currents.

Fortunately, providing the guard rings 36 around the Schottky layer 24, or active region 14, generally tends to reduce the buildup of the electric fields about the periphery of the Schottky layer 24. In select embodiments, such as that shown in FIG. 1, providing the guard rings 36 in the doped recess well 34, which resides at the bottom of the edge termination recess 32, has proven to reduce the buildup of these electric fields much more that simply providing the guard rings 36 in the top surface of the drift layer 22 and in the same plane in which the JB elements 30 are provided. Use of the mesa guard ring 38 provides even further field suppression. While not specifically illustrated, the mesa guard ring 38 may wrap over the edge of the mesa formed in the drift layer 22 and extend into the edge termination recess 32. In such an embodiment, the mesa guard ring 38 may or may not combine with another of the guard rings 36, which are normally spaced apart from one another.

Accordingly, the design of the edge termination region 16 and the JB elements 30 plays an important role in determining the forward and reverse current and voltage characteristics of the Schottky diode 10. As described in further detail below, the JB elements 30, guard rings 36, mesa guard ring 38, and the recess well 34 are formed using ion implantation, wherein ions of the appropriate doping materials are implanted into the exposed top surfaces of the drift layer 22. Applicants have found that using deeper doping regions to form the JB elements 30, guard rings 36, mesa guard ring 38, and even the recess well 34 has proven to provide excellent electric field suppression about the Schottky layer 24 as well as even further improved current and voltage characteristics. Unfortunately, when the drift layer 22 is formed from a material that is somewhat resistant to ion implantation, such as SiC, creating relatively deep doping regions that are doped in a relatively uniform and controlled fashion is challenging.

Figure 8:
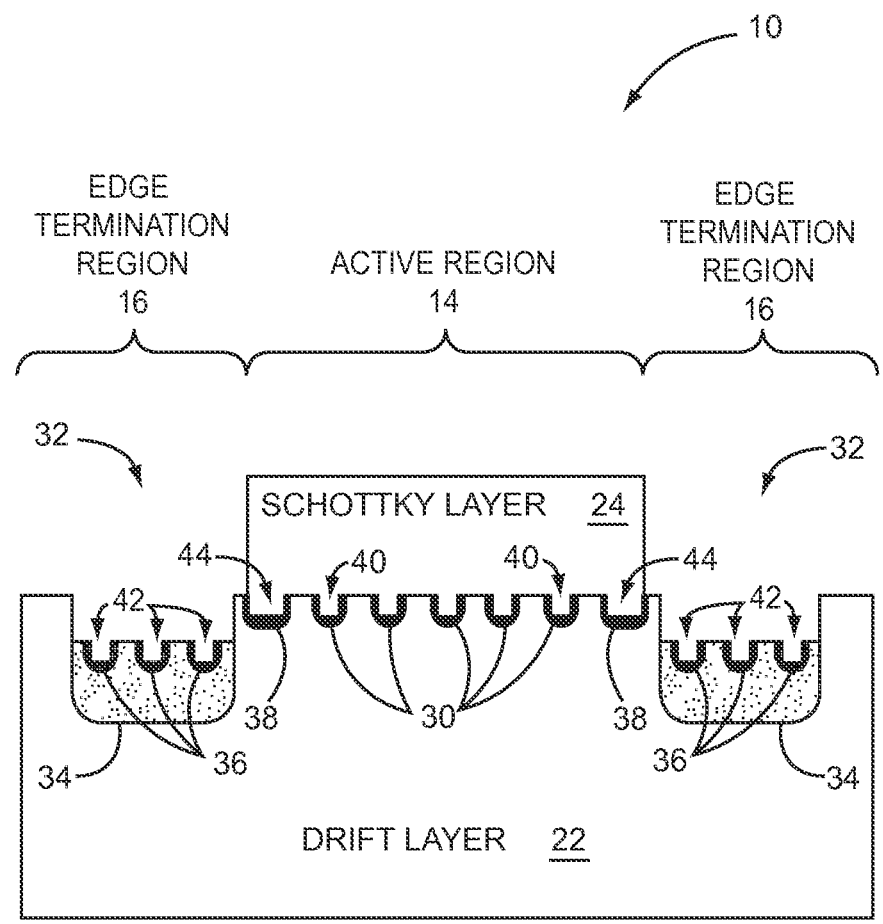
FIG. 8 is a partial cross-sectional view of a Schottky diode that employs recesses in the drift layer for each of the JB elements, guard rings, and mesa guard ring according to one embodiment of the disclosure.

With reference to FIG. 8, the drift layer 22 and the Schottky layer 24 of Schottky diode 10 are illustrated according to an alternative embodiment. As illustrated, each of the JB elements 30, guard rings 36, and mesa guard ring 38 are formed in the drift layer 22 about a corresponding recess that was etched into the top surface of the drift layer 22. In the active region 14, a plurality of JB element recesses 40 and the mesa guard ring 38 are etched in to the drift layer 22. In the edge termination region 16, the edge termination recess 32 is etched in the drift layer 22, and then, guard ring recesses 42 are etched in the bottom surface of the edge termination recess 32 into the drift layer 22. If desired, the recess well 34 may be formed by selectively doping the edge termination recess 32. Once the JB element recesses 40, guard ring recesses 42, the mesa guard ring recess 44, and the edge termination recess 32 are formed, the areas along the sides and at the bottom of the recesses are selectively doped to form the cup- or trough-shaped JB elements 30, guard rings 36, and mesa guard ring 38. By etching recesses into the drift layer 22, the respective the JB elements 30, guard rings 36, and mesa guard ring 38 may be formed more deeply into the drift layer 22. As noted, this is particularly beneficial for SiC devices. The depth and width of the various JB element recesses 40, guard ring recesses 42, and the mesa guard ring recess 44 may be the same or different. When describing the width of a particular recess, the width refers to the narrower lateral dimension of a recess having a width, length, and depth. In one embodiment, the depth of any recess is at least 0.1 microns, and the width of any recess is at least 0.5 microns. In another embodiment, the depth of is recesses are at least 1.0 microns, and the width of any recess is at least 3.0 microns.

Figure 9:
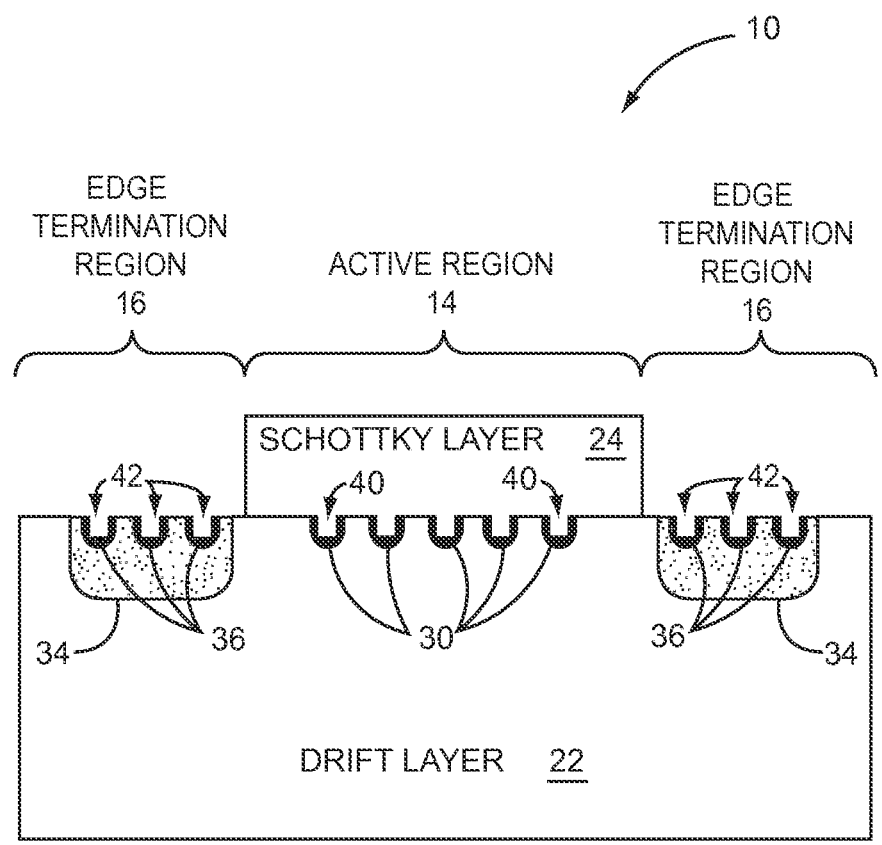
FIG. 9 is a partial cross-sectional view of a Schottky diode that employs recesses in the drift layer for each of the JB elements, guard rings, and mesa guard ring according to another embodiment of the disclosure.

With reference to FIG. 9, another embodiment is provided that employs JB element recesses 40, guard ring recesses 42, and the mesa guard ring recess 44. However, in this embodiment, there is no edge termination recess 32, mesa guard ring recess 44, or mesa guard ring 38. Instead, the guard ring recesses 42 are formed on the same plane as the JB element recesses 40, and the JB elements 30 and the guard rings 36 are formed along the sides and at the bottom of these recesses. In either of the embodiments of FIGS. 7 and 8, the recess well 34 is optional.

While the above embodiments are directed to Schottky diodes 10, all of the contemplated structures and designs of the edge termination region 16, including the structures and designs of the recess well 34, the guard rings 36, and the guard ring recesses 42, are equally applicable to other semiconductor devices that suffer from adverse field effects about the periphery of an active region. Exemplary devices that may benefit from the contemplated structures and designs of the edge termination region 16 include all types of field effect transistors (FETs), insulated gate bipolar transistors (IGBTs), and gate turn-off thyristors (GTOs).

Another characteristic that affects both forward and reverse current and voltage characteristics of the Schottky diode 10 is the barrier height associated with the Schottky junction J1 (FIGS. 6 and 7), which again, is the metal-semiconductor junction between the metal Schottky layer 24 and the semiconductor drift layer 22. When a metal layer, such as the Schottky layer 24, is in close proximity with a semiconductor layer, such as the drift layer 22, a native potential barrier develops between the two layers. The barrier height associated with the Schottky junction J1 corresponds to the native potential barrier. Absent application of an external voltage, this native potential barrier prevents most charge carriers, either electrons or holes, from moving from one layer to another the other. When an external voltage is applied, the native potential barrier from the semiconductor layer's perspective will effectively increase or decrease. Notably, the potential barrier from the metal layer's perspective will not change, when the external voltage is applied.

When a Schottky diode 10 with an N-type drift layer 22 is forward biased, application of a positive voltage at the Schottky layer 24 effectively reduces the native potential barrier and causes electrons to flow from the semiconductor across the metal-semiconductor junction. The magnitude of the native potential barrier, and thus barrier height, bears on the amount of voltage necessary to overcome the native potential barrier and cause the electrons to flow from the semiconductor layer to the metal layer. In effect, the potential barrier is reduced when the Schottky diode is forward biased. When the Schottky diode 10 is reverse biased, the potential barrier is greatly increased and functions to block the flow of electrons.

The material used to form the Schottky layer 24 largely dictates the barrier height associated with the Schottky junction J1. In many applications, a low barrier height is preferred. A lower barrier height allows one of the following. First, a lower barrier height device with a smaller active region 14 can be developed to have the same forward turn on and operating current and voltage ratings as a device having a larger active region 14 and a higher barrier height. In other words, the lower barrier height device with a smaller active region 14 can support the same forward voltage at a given current as a device that has a higher barrier height and a larger active region 14. Alternatively, a lower barrier height device may have lower forward turn on and operating voltages while handling the same or similar currents as a higher barrier height device when both devices have active regions 14 of the same size. Lower barrier heights also lower the forward biased on-resistances of the devices, which help make the devices more efficient and generate less heat, which can be destructive to the device. Exemplary metals (including alloys) that are associated with low barrier heights in Schottky applications that employ a SiC drift layer 22 include, but are not limited to, tantalum (Ta), titanium (Ti), chromium (Cr), and aluminum (Al), where tantalum is associated with the lowest barrier height of the group. The metals are defined as low barrier height capable metals. While the barrier height is a function of the metal used for the Schottky layer 24, the material used for the drift layer 22, and perhaps the extent of doping in the drift layer 22, exemplary barrier heights that may be achieved with certain embodiments are less than 1.2 election volts (eV), less than 1.1 eV, less than 1.0 eV, less than 0.9 eV, and less than about 0.8 eV.

Turning now to FIGS. 10-24, an exemplary process for fabricating a Schottky diode 10, such as the one illustrated in FIG. 1, is provided. In this example, assume that the JB elements 30 are elongated stripes, as illustrated in FIG. 2. Through the description of the process, exemplary materials, doping types, doping levels, structure dimensions, and the selected alternatives are outlined. These aspects are merely illustrative, and the concepts disclosed herein and the claims that follow are not limited to these aspects.

Figure 10:
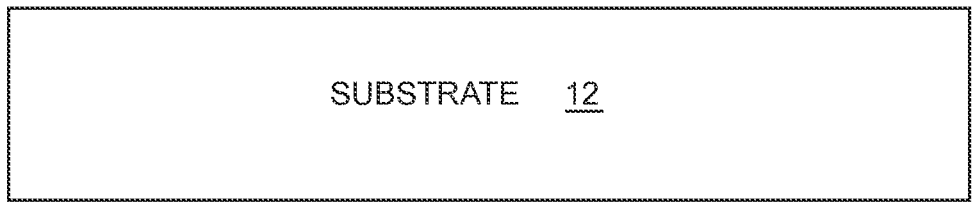
FIGS. 10 through 25 illustrate select processing steps for fabricating a Schottky diode according to the embodiment illustrated in FIG. 1.

The process starts by providing an N-doped, single crystal, 4H SiC substrate 12, as shown in FIG. 10. The substrate 12 may have various crystalline polytypes, such as 2H, 4H, 6H, 3C and the like. The substrate may also be formed from other material systems, such as gallium nitride (GaN), gallium arsenide (GaAs), silicon (Si), germanium (Ge), SiGe, and the like. The resistivity of the N-doped, SiC substrate 12 is between about 10 milliohm-cm and 30 milliohm-cm in one embodiment. The initial substrate 12 may have a thickness between about 200 microns and 500 microns.

Figure 11:
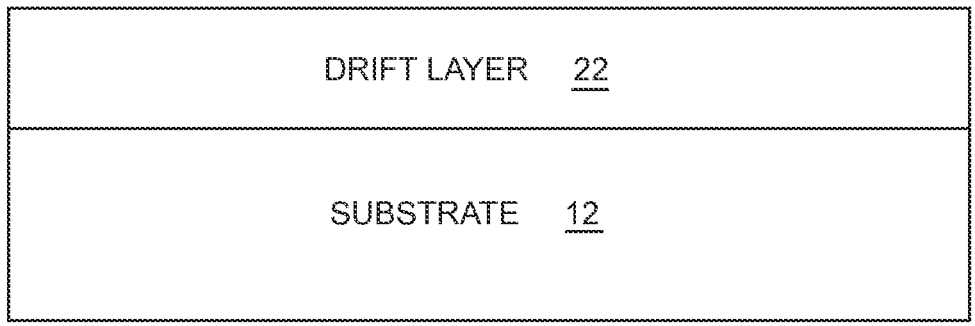

The drift layer 22 may be grown over the substrate 12 and doped in situ, wherein the drift layer 22 is doped as it is grown with an N-type doping material, as shown in FIG. 11. Notably, one or more buffer layers (not shown) may be formed on the substrate 12 prior to forming the drift layer 22. The buffer layer may be used as a nucleation layer and be relatively heavily doped with an N-type doping material. The buffer layer may range from 0.5 to 5 microns in certain embodiments.

The drift layer 22 may be relatively uniformly doped throughout or may employ graded doping throughout all or a portion thereof. For a uniformly doped drift layer 22, the doping concentration may be between about $2 \times 10^{15}$ cm$^{-3}$ and $1 \times 10^{16}$ cm$^{-3}$ in one embodiment. With graded doping, the doping concentration is highest at the bottom of the drift layer 22 near the substrate 12 and lowest at the top of the drift layer 22 near the Schottky layer 24. The doping concentration generally decreases in a stepwise or continuous fashion from a point at or near the bottom to a point at or near the top of the drift layer 22. In one embodiment employing graded doping, the lower portion of the drift layer 22 may be doped at a concentration of about $1 \times 10^{15}$ cm$^{-3}$ and the upper portion of the drift layer 22 maybe doped at a concentration of about $5 \times 10^{16}$ cm$^{-3}$. In another embodiment employing graded doping, the lower portion of the drift layer 22 may be doped at a concentration of about $5 \times 10^{15}$ cm$^{-3}$ and the upper portion of the drift layer 22 maybe doped at a concentration of about $1 \times 10^{16}$ cm$^{-3}$.

The drift layer 22 may be between four and ten microns thick in select embodiments depending on the desired reverse breakdown voltage. In one embodiment, the drift layer 22 is about one micron thick per 100 volts of desired reverse breakdown voltage. For example, a Schottky diode 10 with a reverse breakdown voltage of 600 volts may have a drift layer 22 with a thickness of about six microns.

Figure 12:
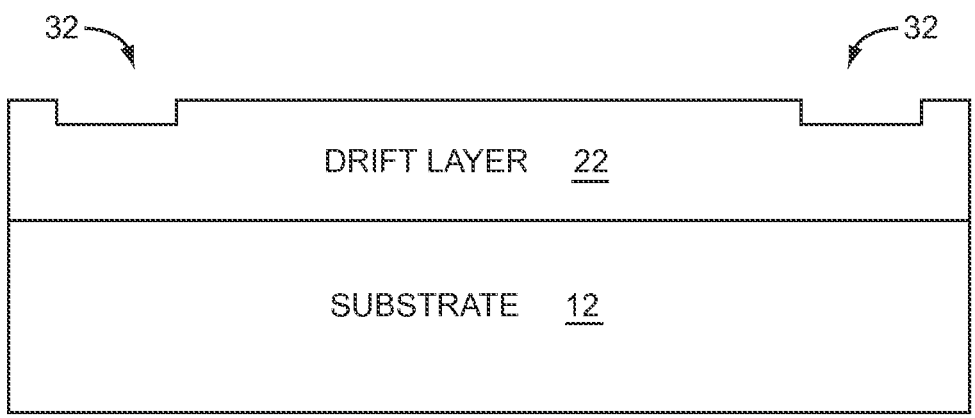

Once the drift layer 22 is formed, the top surface is etched to create the edge termination recesses 32, as shown in FIG. 12. The edge termination recesses 32 will vary in depth and width based on the desired device characteristics. In one embodiment of a Schottky diode 10 that has a reverse breakdown voltage of 600V and can handle a sustained forward current of 50 A, the edge termination recess 32 has a depth of between about 0.2 and 0.5 microns and a width of between about 10 and 120, which will ultimately depend on how many guard rings 36 are employed in the device.

Figure 13:
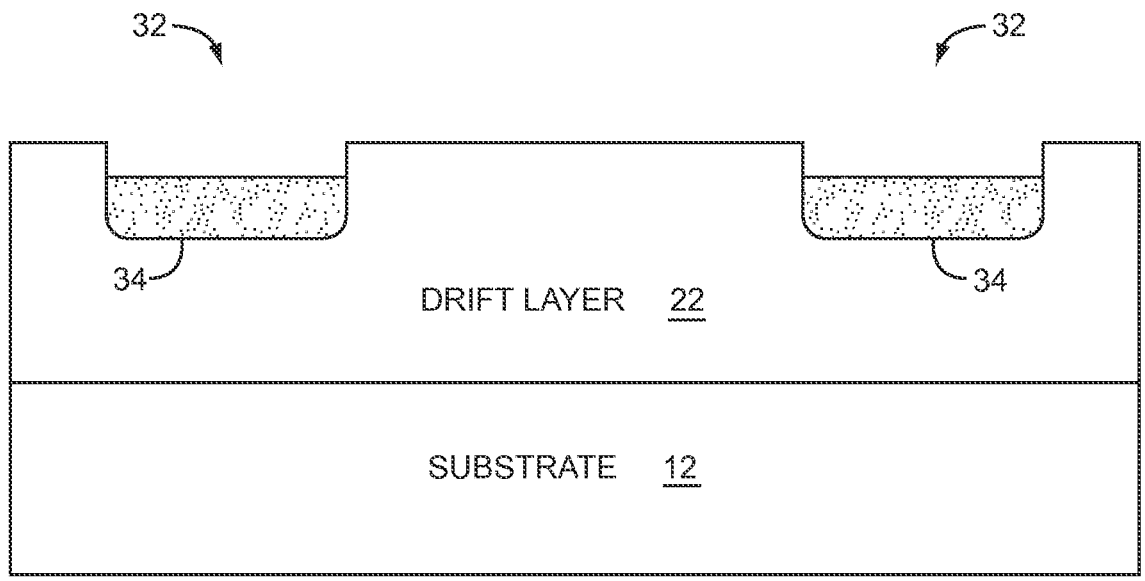

Next, the recess well 34 is formed by selectively implanting a portion of the drift layer 22 that resides at the bottom of the edge termination recess 32 with a P-type material, as shown in FIG. 13. For example, a Schottky diode 10 with a reverse breakdown voltage of 600 volts and capable of handling a sustained forward current of 50 A may have a recess well 34 that is lightly doped at a concentration between about $5 \times 10^{16}$ cm$^{-3}$ and $2 \times 10^{17}$ cm$^{-3}$. The recess well 34 may be between about 0.1 and 0.5 microns deep and have a width substantially corresponding to the width of the edge termination recess 32.

Figure 14:
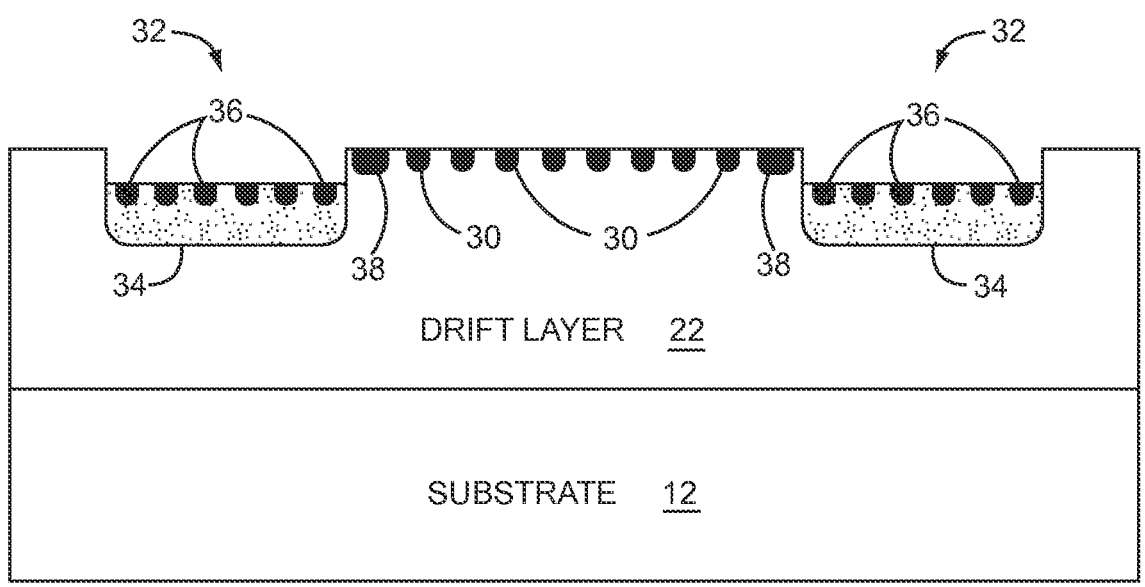

Once the recess well 34 is formed, the JB elements 30, the mesa guard ring 38, and the guard rings 36 are formed by selectively implanting the corresponding portions of the top surface of the drift layer 22, including the bottom surface of the edge termination recess 32 with a P-type material, as shown in FIG. 14. The JB elements 30, the mesa guard ring 38, and the guard rings 36 are relatively heavily doped and may be formed at the same time using the same ion implantation process. In one embodiment, a Schottky diode 10 with a reverse breakdown voltage of 600 volts and capable of handling a sustained forward current of 50 A may have the JB elements 30, the mesa guard ring 38, and the guard rings 36 all doped at a concentration between about $5 \times 10^{17}$ cm$^{-3}$ and $5 \times 10^{19}$ cm$^{-3}$. In other embodiments, these elements may be doped at different concentrations using the same or different ion implantation process. For example, when the JB array of JB elements 30 includes different shapes or sizes, as provided in FIGS. 4 and 5, or where the different JB elements 30 have different depths. The depth and spacing between adjacent JB elements 30, between the mesa guard ring 38 and a JB element 30, and between adjacent guard rings 36 may vary based on desired device characteristics. For example, the depth of these elements may range from 0.2 to greater than 1.5 microns, and the respective elements may be spaced apart from each other between about one and four microns.

For embodiments like those illustrated in FIGS. 8 and 9 that employ JB element recesses, or a mesa guard ring recess 44, or guard ring recesses 42, the respective JB elements 30, the mesa guard ring 38, and the guard rings 36 are more easily formed deeper into the drift layer 22. For a drift layer 22 that is formed from SiC, the depth of the respective recesses may be between about 0.1 and 1.0 microns and have widths of between about 1.0 and 5.0 microns. As such, the overall depth of the JB elements 30, the mesa guard ring 38, and the guard rings 36 can readily extend to depths, as measured from the top surface of the drift layer 22, of between 0.5 and 1.5.

Figure 15:
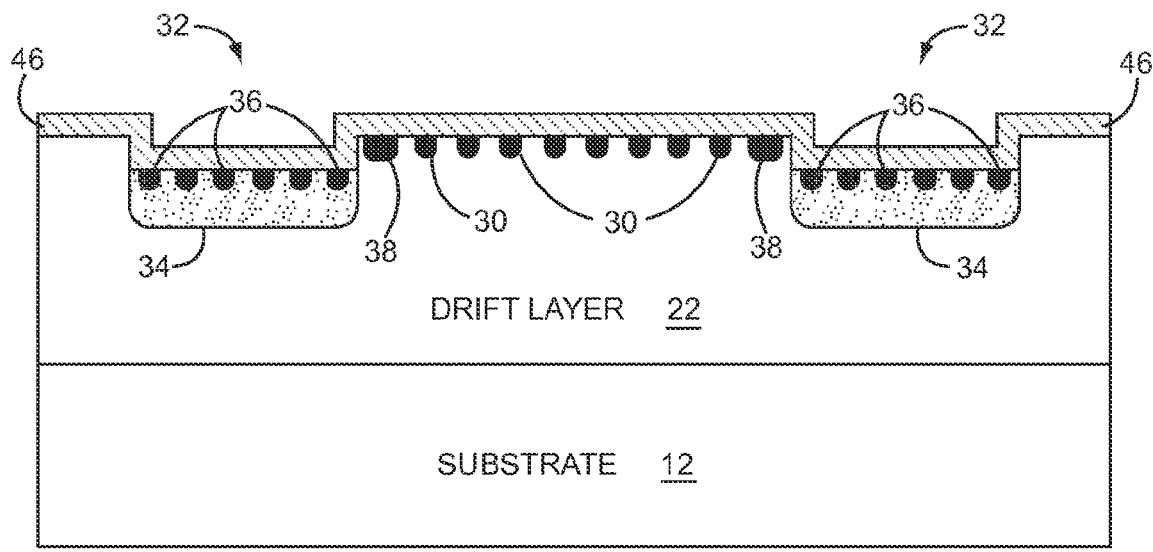
Figure 16:
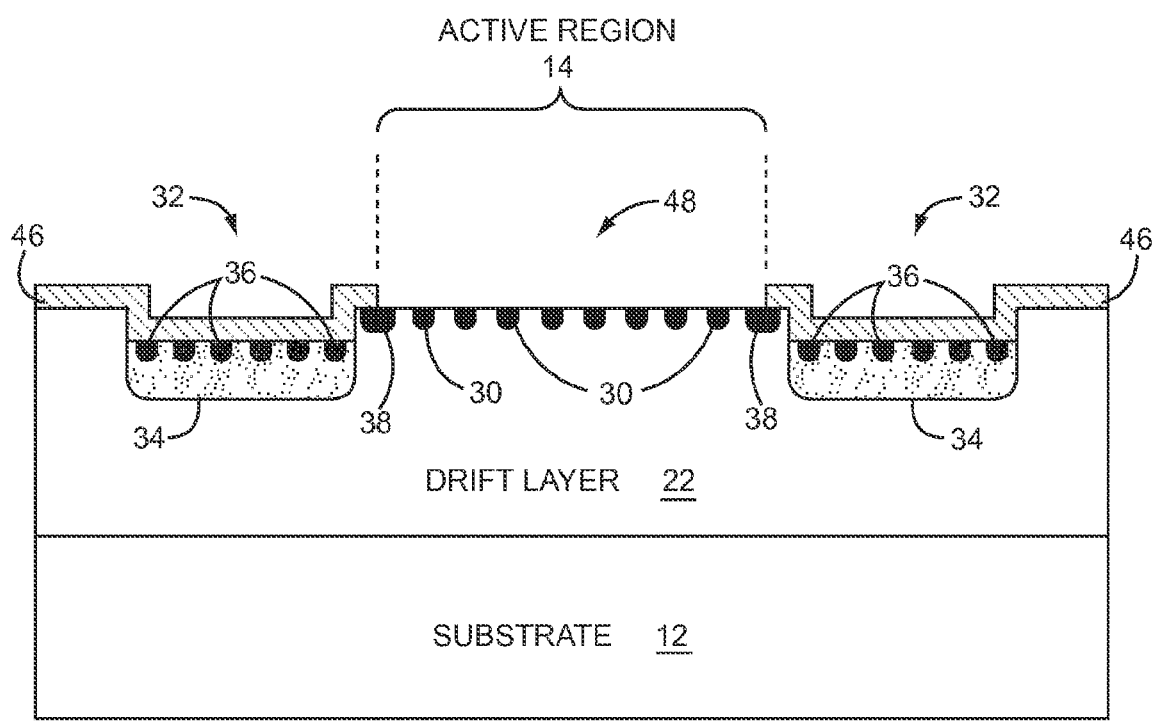

As illustrated in FIG. 15, a thermal oxide layer 46 is formed over the top surface of the drift layer 22, including the bottom surface of the edge termination recess 32. For a SiC drift layer 22, the oxide is silicon dioxide (SiO$_2$). The thermal oxide layer 46 may act as a passivation layer that aids in the protection or performance of the drift layer 22 and the various elements formed therein. Next, the portion of the thermal oxide layer 46 associated with the active region 14 is removed, as shown in FIG. 16, to form a Schottky recess 48 in which the Schottky layer 24 will be formed.

Figure 17:
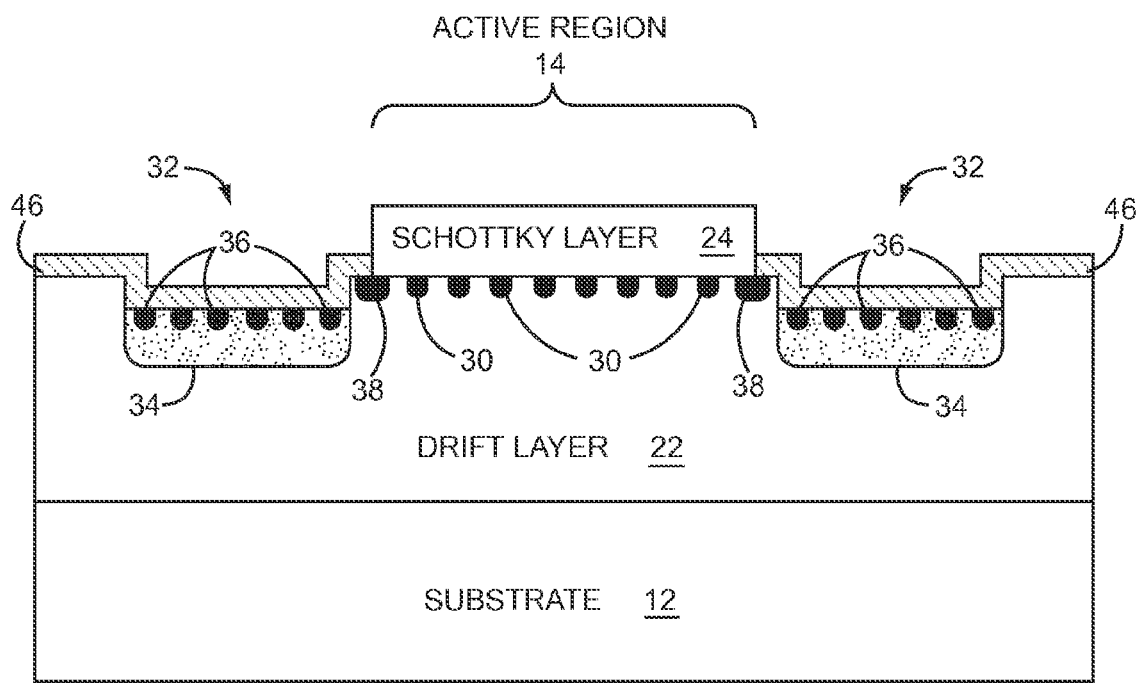

Once the Schottky recess 48 is formed, the Schottky layer 24 is formed over the portion of drift layer 22 that was exposed by the Schottky recess 48, as illustrated in FIG. 17. The thickness of the Schottky layer 24 will vary based on desired device characteristics and the metal used to form the Schottky layer 24, but will generally be between about 100 and 4500 angstroms. For the referenced 600V device, a Schottky layer 24 formed of tantalum (Ta) may be between about 200 and 1200 angstroms; a Schottky layer 24 formed of titanium (Ti) may be between about 500 and 2500 angstroms; and a Schottky layer 24 formed of aluminum (Al) may be between about 3500 and 4500 angstroms. As noted above, tantalum (Ta) is associated with a very low barrier height, especially when used in combination with SiC to form a Schottky junction. Tantalum is also very stable against SiC.

Figure 18:
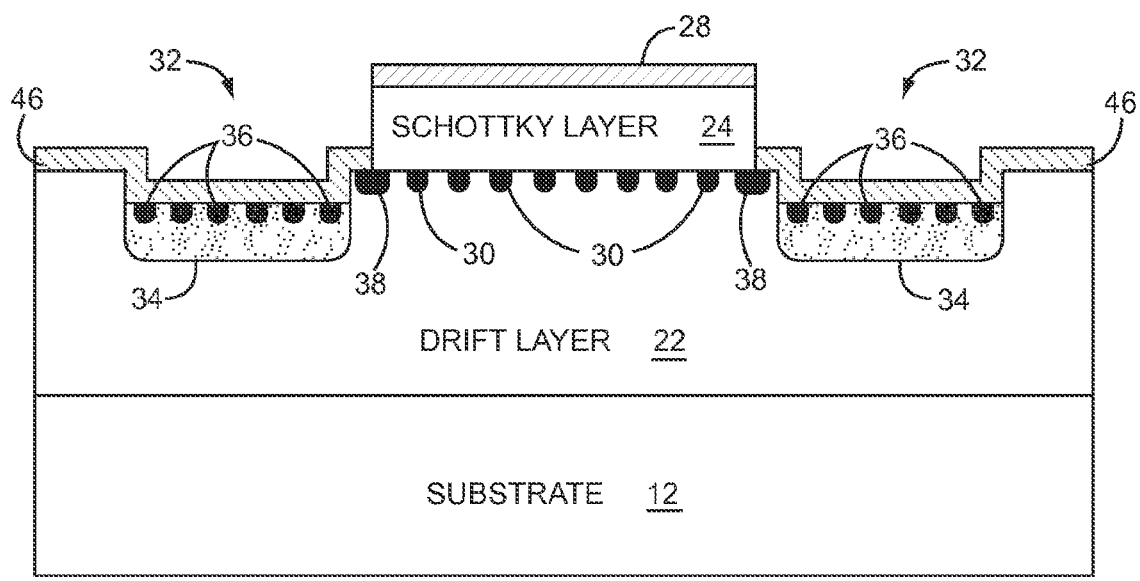

Depending on the metal used for the Schottky layer 24 and the to-be-formed anode contact 26, one or more barrier layers 28 may be formed over the Schottky layer 24, as shown in FIG. 18. The barrier layer 28 may be formed of titanium tungsten alloy (TiW), titanium nickel alloy (TiN), tantalum (Ta), and any other suitable material, and may be between about 75 and 400 angstroms thick in select embodiments. The barrier layer 28 helps prevent diffusion between the metals used to form the Schottky layer 24 and the to-be-formed anode contact 26. Notably, the barrier layer 28 is not used in certain embodiments where the Schottky layer 24 is tantalum (Ta) and the to-be-formed anode contact 26 is formed from aluminum (Al). The barrier layer 28 is generally beneficial in embodiments where the Schottky layer 24 is titanium (Ti) and the to-be-formed anode contact 26 is formed from aluminum (Al).

Figure 19:
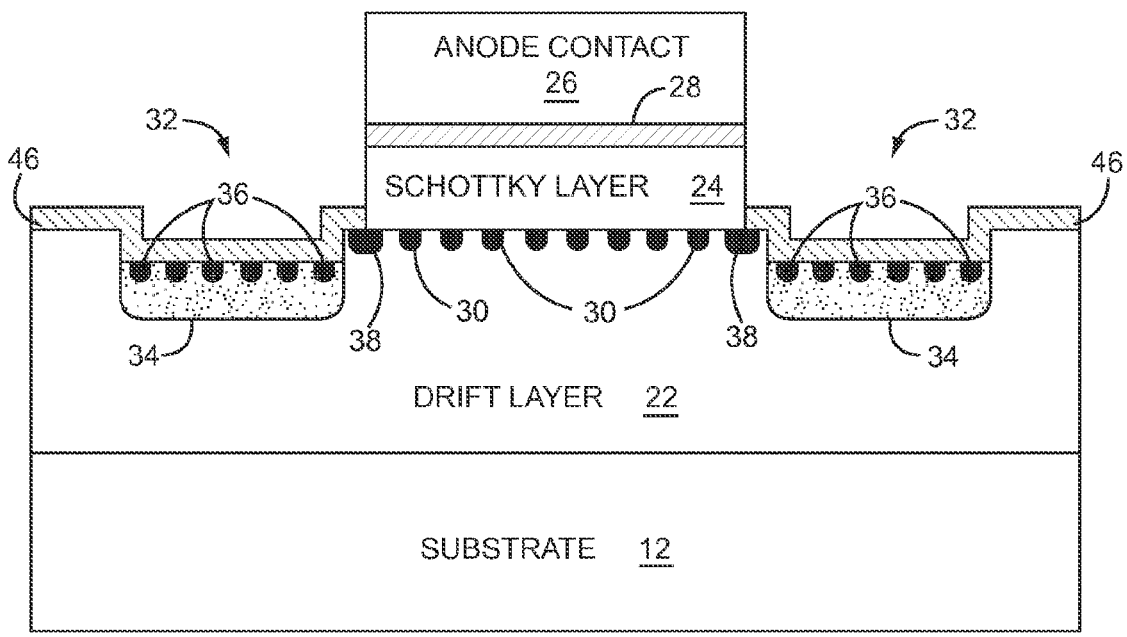

Next, the anode contact 26 is formed over the Schottky layer 24, or if present, the barrier layer 28, as shown in FIG. 19. The anode contact 26 is generally relatively thick, formed from a metal, and acts as a bond pad for the anode of the Schottky diode 10. The anode contact 26 may be formed from aluminum (Al), gold (Au), Silver (Ag), and the like.

Figure 20:
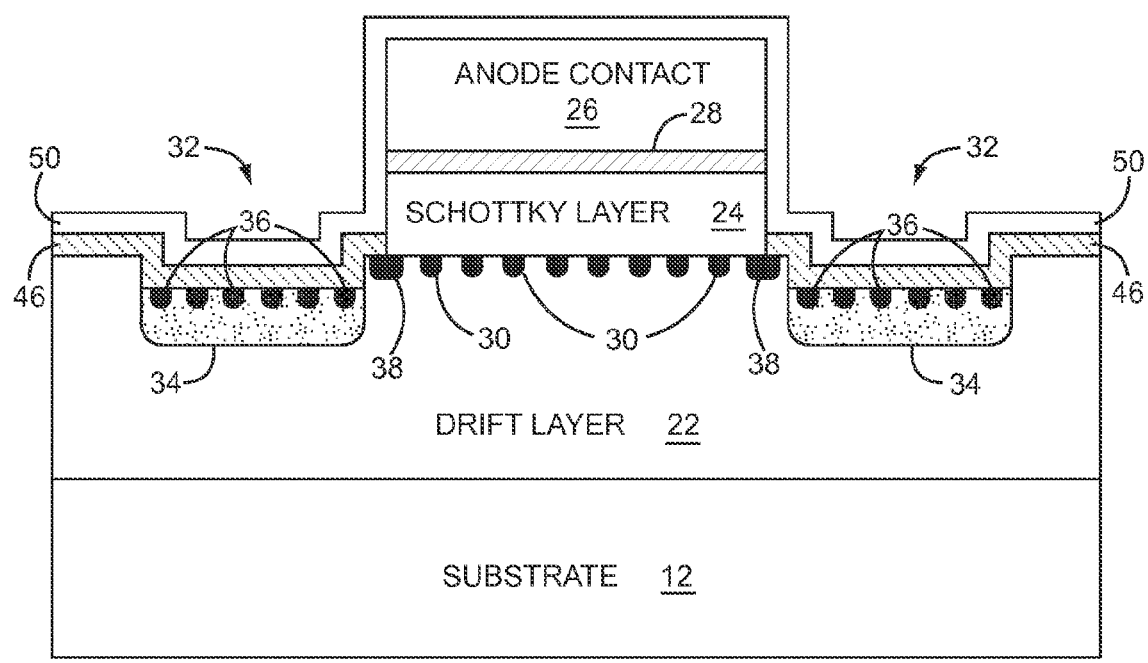
Figure 21:
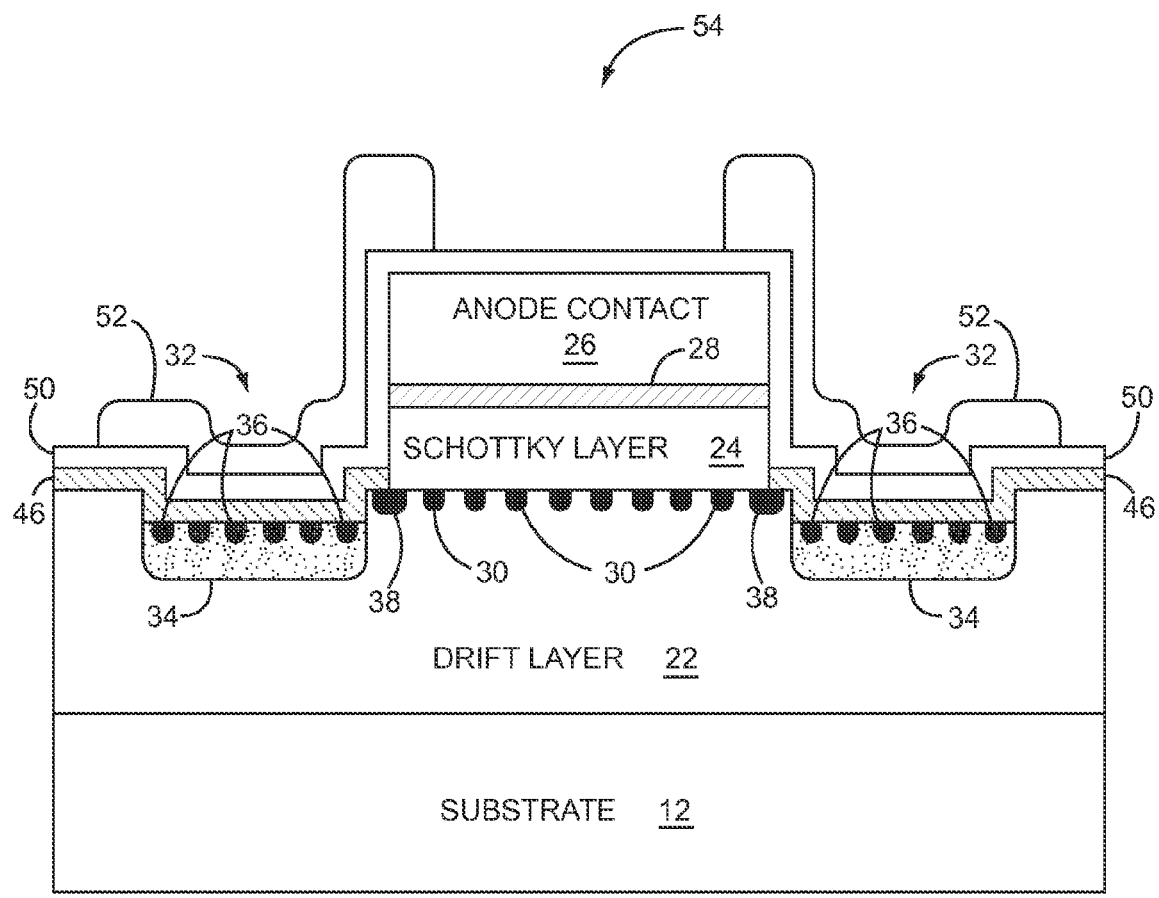
Figure 22:
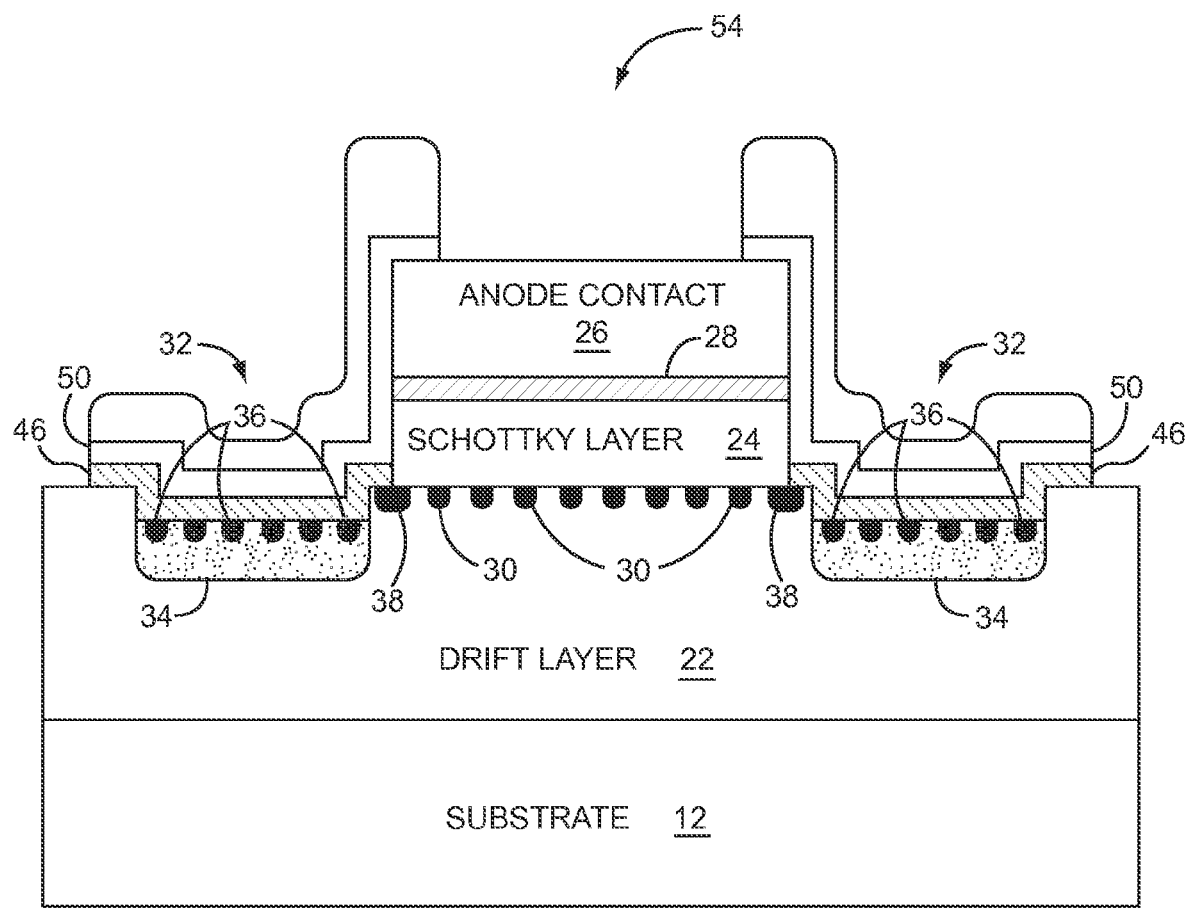

An encapsulant layer 50 is then formed over at least the exposed surfaces of the thermal oxide layer 46 and the anode contact 26, as illustrated in FIG. 20. The encapsulant layer 50 may be a nitride, such as silicon nitride (SiN), and acts as a conformal coating to protect the underlying layers from adverse environmental conditions. For further protection against scratches or like mechanical damage, a polyimide layer 52 may be provided over the encapsulant layer 50, as illustrated in FIG. 21. A central portion of the polyimide layer 52 is removed to provide an anode opening 54 over the encapsulant layer 50. In this example, the polyimide layer 52 is used as an etch mask having the anode opening 54 centered over the anode contact 26. Next, the portion of the encapsulant layer 50 that is exposed by the anode opening 54 is removed to expose the top surface of the anode contact 26, as illustrated in FIG. 22. Ultimately, bond wires or the like may be soldered or otherwise connected to the top surface of the anode contact 26 through the anode opening 54 in the encapsulant layer 50.

Figure 23:
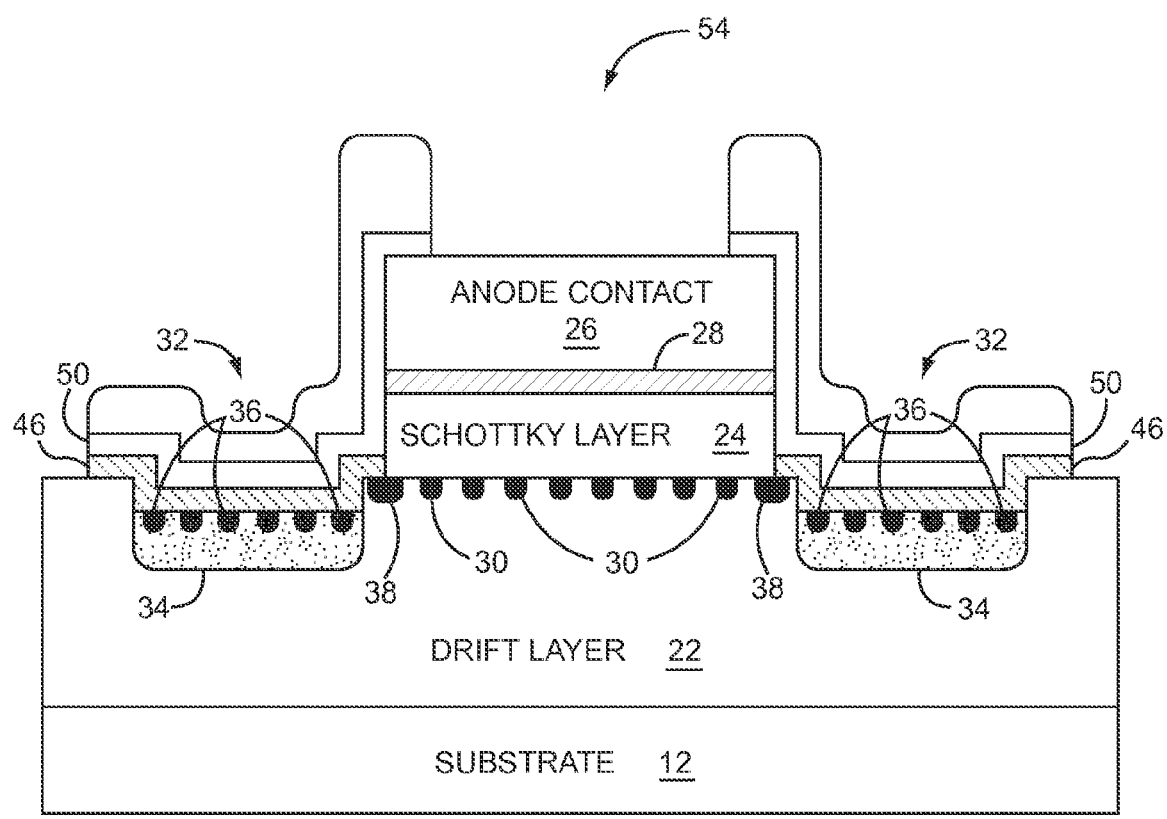

At this point, processing switches from the front side (top) of the Schottky diode 10 to the back side (bottom) of the Schottky diode 10. As illustrated in FIG. 23, the substrate 12 is substantially thinned by removing a bottom portion of the substrate 12 though a grinding, etching, or like process. For the 600V reference Schottky diode 10, the substrate 12 may be thinned to a thickness between about 50 and 200 microns in a first embodiment, and between about 75 and 125 microns in a second embodiment. Thinning the substrate 12 or otherwise employing a thin substrate 12 reduces the overall electrical and thermal resistance between the anode and cathode of the Schottky diode 10 and allows the device to handle higher current densities without overheating.

Figure 24:
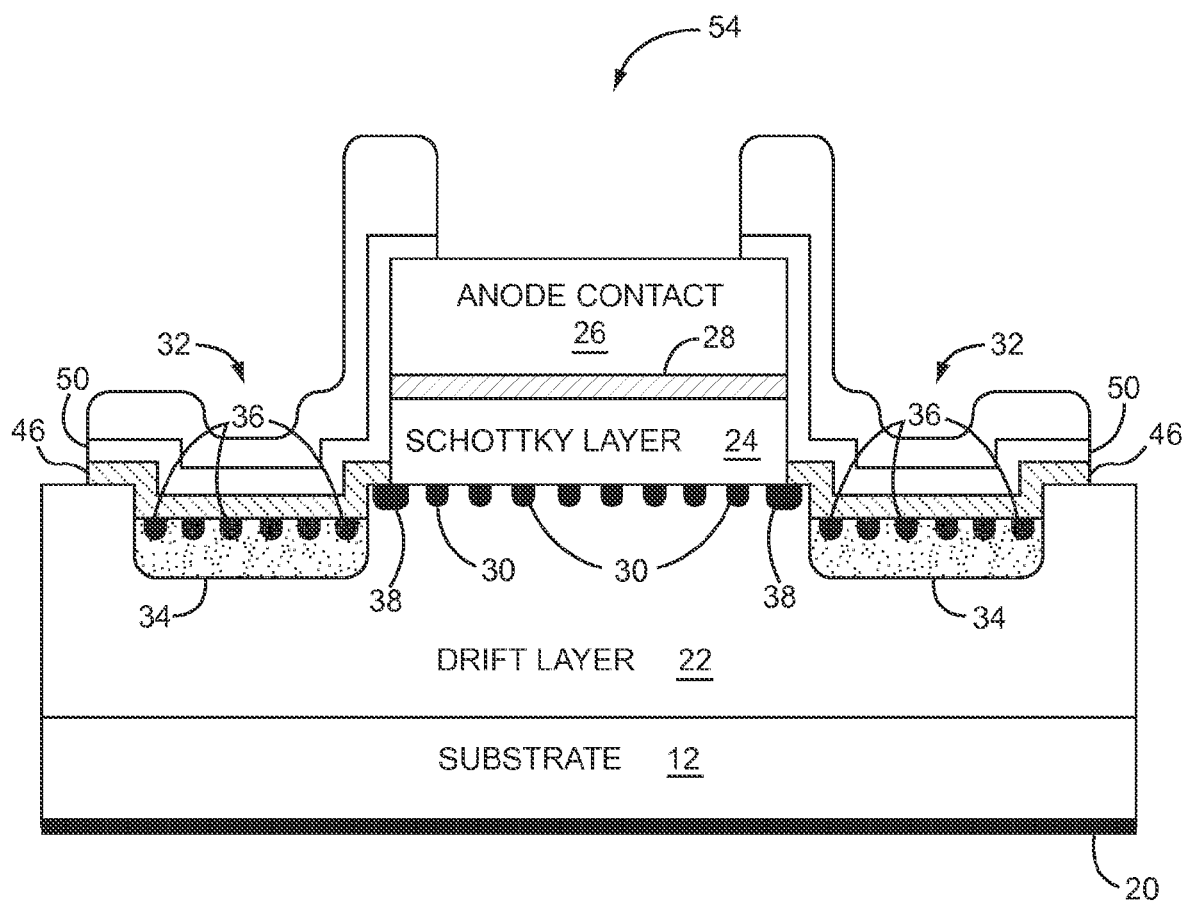
Figure 25:
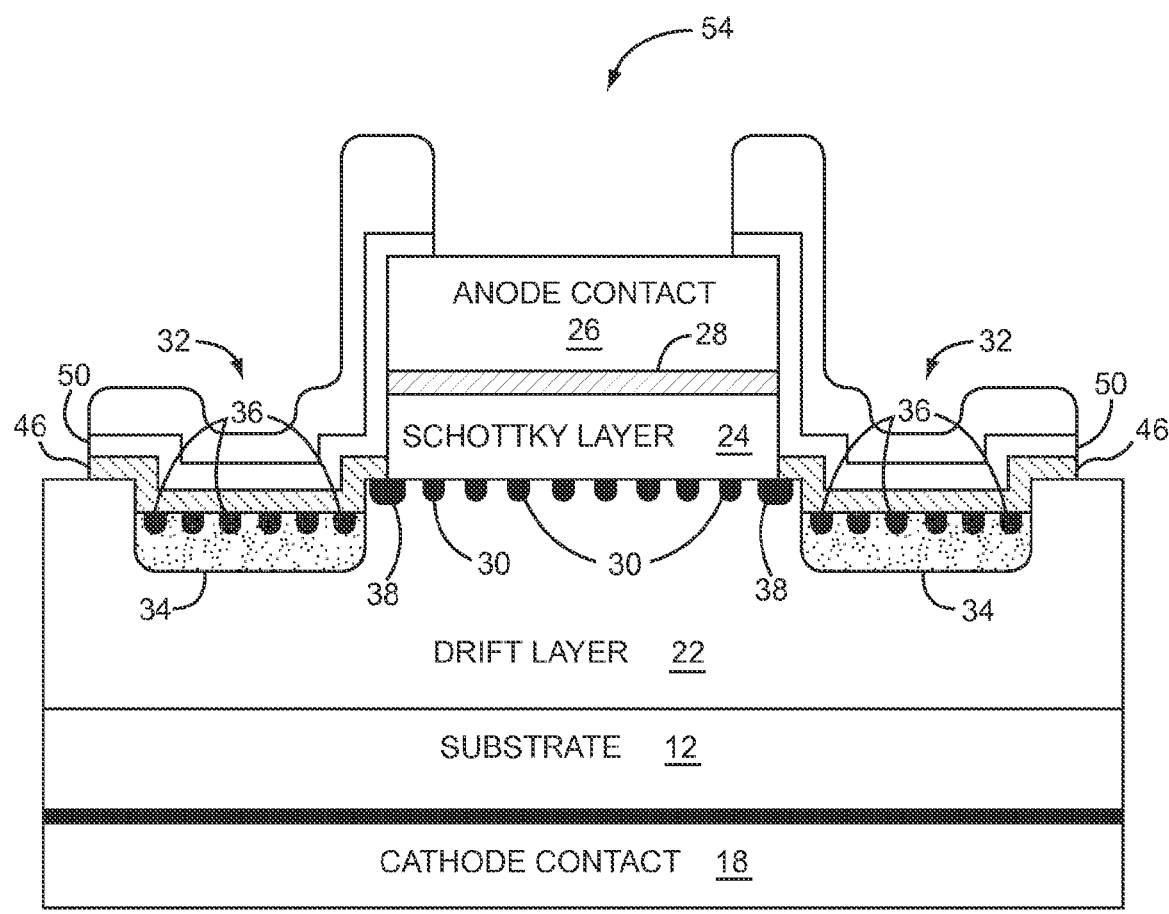

Finally, the cathode ohmic layer 20 is formed on the bottom of the thinned substrate 12 with an ohmic metal, such as nickel (Ni), nickel silicide (NiSi), and nickel aluminide (NiAl), as illustrated in FIG. 24. In embodiments where the polyimide layer 52 is employed, the cathode ohmic layer 20 may be laser annealed instead of baking the entire device at a high temperature to anneal the ohmic metal. Laser annealing allows the ohmic metal to be heated sufficiently for annealing, yet does not heat the rest of the device to temperatures that would otherwise damage or destroy the polyimide layer 52. Once the cathode ohmic layer 20 is formed and annealed, the cathode contact 18 is formed over the cathode ohmic layer 20 to provide a solder or like interface for the Schottky diode 10, as illustrated in FIG. 25.

With the concepts disclosed herein, very high performance Schottky diodes 10 may be designed for various applications that require various operation parameters. The current density associated with DC forward biased currents may exceed 440 amperes/cm in certain embodiments, and may exceed 500 amperes/cm in other embodiments. Further, Schottky diodes 10 may be constructed to have a ratio of DC forward biased current density to reverse biased anode-cathode capacitance greater than 0.275, 0.3, 0.325, 0.35, 0.375, and 0.4 ampere/pico-Farad (A/pF) in various embodiments, wherein the reverse biased anode-cathode voltage is determined when the Schottky diode is reverse biased to a point where the active region is essentially fully depleted.

Those skilled in the art will recognize improvements and modifications to the embodiments of the present disclosure. All such improvements and modifications are considered within the scope of the concepts disclosed herein and the claims that follow.

What is claimed is:

1. A Schottky diode comprising:
   a drift layer having a first surface associated with an active region and an edge termination region substantially laterally adjacent the active region, the active region being provided on a mesa in the drift layer and including a mesa guard ring, wherein the drift layer is predominantly doped with a doping material of a first conductivity type and the edge termination region has an edge termination recess extending into the drift layer from the first surface;
   a Schottky layer over the active region of the first surface to form a Schottky junction, the Schottky layer formed from a low barrier height capable metal;
   an edge termination structure formed in a bottom surface of the edge termination recess that is non-planar with the mesa guard ring.

2. The Schottky diode of claim 1 wherein the Schottky junction has a barrier height of less than 0.9 electron volts.

3. The Schottky diode of claim 1 wherein:
   the low barrier height capable metal of the Schottky layer comprises tantalum;
   the edge termination recess extends substantially about the active region; and
   the edge termination structure comprises a plurality of guard rings that extend substantially about the active region.

4. The Schottky diode of claim 3 wherein the mesa guard ring extends substantially about the Schottky layer such that the mesa guard ring resides between the Schottky layer and the plurality of guard rings.

5. The Schottky diode of claim 4 wherein a recess well is formed in the drift layer below the bottom surface of the edge termination recess, and the recess well is doped with a doping material of a second conductivity type, which is opposite the first conductivity type.

6. The Schottky diode of claim 3 wherein the drift layer is formed over a thinned substrate that was thinned after the drift layer was formed.

7. The Schottky diode of claim 6 wherein the low barrier height capable metal of the Schottky layer consists essentially of tantalum.

8. The Schottky diode of claim 3 wherein:
   the low barrier height capable metal of the Schottky layer comprises tantalum; and
   the drift layer comprises silicon carbide.

9. The Schottky diode of claim 8 wherein the low barrier height capable metal of the Schottky layer consists essentially of tantalum.

10. The Schottky diode of claim 1 wherein the low barrier height capable metal of the Schottky layer comprises tantalum.

11. The Schottky diode of claim 1 wherein the low barrier height capable metal of the Schottky layer comprises at least one of a group consisting of titanium, chromium, and aluminum.

12. The Schottky diode of claim 1 wherein the low barrier height capable metal of the Schottky layer consists essentially of tantalum.

13. The Schottky diode of claim 1 wherein the edge termination structure comprises as least one guard ring.

14. The Schottky diode of claim 1 wherein the edge termination recess extends substantially about the active region and the edge termination structure comprises a plurality of guard rings that extend substantially about the active region.

15. The Schottky diode of claim 14 wherein the mesa guard ring extends substantially about the Schottky layer such that the mesa guard ring resides between the Schottky layer and the plurality of guard rings.

16. The Schottky diode of claim 15 wherein the first surface of the drift layer about the active region comprises a mesa guard ring recess such that the mesa guard ring is a doped region that extends into the drift layer about the mesa guard ring recess, and the doped region is doped with a doping material of a second conductivity type, which is opposite the first conductivity type.

17. The Schottky diode of claim 14 wherein a recess well is formed in the drift layer below the bottom surface of the edge termination recess, and the recess well is doped with a doping material of a second conductivity type, which is opposite the first conductivity type.

18. The Schottky diode of claim 14 wherein the bottom surface of the edge termination recess comprises a plurality of guard ring recesses such that at least some of the plurality of guard rings are doped regions that extend into the drift layer about corresponding ones of the plurality of guard ring recesses, and the doped regions are doped with a doping material of a second conductivity type, which is opposite the first conductivity type.

19. The Schottky diode of claim 1 wherein the drift layer is formed over a thinned substrate that was thinned after the drift layer was formed and a cathode contact is formed over a bottom surface of the thinned substrate.

20. The Schottky diode of claim 19 wherein the thinned substrate is between about 50 and 200 microns thick.

21. The Schottky diode of claim 1 wherein the edge termination recess is greater than 0.2 microns deep.

22. The Schottky diode of claim 1 wherein the edge termination recess is between about 0.2 and 0.5 microns deep.

23. The Schottky diode of claim 1 further comprising an array of junction barrier elements formed in the drift layer below the Schottky junction.

24. The Schottky diode of claim 23 wherein each junction barrier element of the array of junction barrier elements are substantially the same as others of the array of junction barrier elements.

25. The Schottky diode of claim 23 wherein at least a first junction barrier element of the array of junction barrier elements is substantially different in size or shape than at least a second junction barrier element of the array of junction barrier elements.

26. The Schottky diode of claim 23 wherein at least certain junction barrier elements in the array of junction barrier elements are elongated stripes.

27. The Schottky diode of claim 23 wherein at least certain junction barrier elements in the array of junction barrier elements are substantially round in the first surface.

28. The Schottky diode of claim 23 wherein the first surface of the drift layer comprises a plurality of junction barrier element recesses in the active region such that at least certain junction barrier elements of the array of junction barrier elements are doped regions that extend into the drift layer about corresponding ones of the plurality of junction barrier element recesses, and the doped regions are doped with a doping material of a second conductivity type, which is opposite the first conductivity type.

29. The Schottky diode of claim 1 wherein the drift layer is predominantly doped with the doping material of the first conductivity type in a graded fashion wherein the drift layer has a lower doping concentration near the first surface and an intentionally higher doping concentration near a second surface of the drift layer, the second surface being substantially opposite the first surface.

30. The Schottky diode of claim 1 wherein the drift layer comprises silicon carbide.

31. The Schottky diode of claim 1 wherein when forward biased, supports a DC current density of at least 440 amperes/cm.

32. The Schottky diode of claim 1 wherein when forward biased, supports a DC current density of at least 500 amperes/cm.

33. The Schottky diode of claim 1 wherein a ratio of DC forward biased current density to reverse biased anode-cathode capacitance is at least 0.275 ampere/pico-Farad, wherein the anode-cathode capacitance is at least 0.275 ampere/pica-Farad when the Schottky diode is reverse biased to a point where the active region is essentially fully depleted.

34. The Schottky diode of claim 1 wherein a ratio of DC forward biased current density to reverse biased anode-cathode capacitance is at least 0.3 ampere/pico-Farad, wherein the anode-cathode capacitance is at least 0.3 ampere/pico-Farad when the Schottky diode is reverse biased to a point where the active region is essentially fully depleted.

35. The Schottky diode of claim 1 wherein a ratio of DC forward biased current density to reverse biased anode-cathode capacitance is at least 0.35 ampere/pico-Farad, wherein the anode-cathode capacitance is at least 0.35 ampere/pico-Farad when the Schottky diode is reverse biased to a point where the active region is essentially fully depleted.

36. A Schottky diode comprising:
a drift layer having a first surface associated with an active region and an edge termination region substantially laterally adjacent the active region, the active region being provided on a mesa in the drift layer and including a mesa guard ring, wherein the drift layer comprises silicon carbide and is doped with a doping material of a first conductivity type and the edge termination region has an edge termination recess extending into the drift layer from the first surface;
a Schottky layer over the active region of the first surface to form a Schottky junction, the Schottky layer formed comprising tantalum;
an edge termination structure formed in a bottom surface of the edge termination recess that is non planar with the mesa guard ring; and
an array of junction barrier elements formed below the Schottky junction and in the drift layer.

37. The Schottky diode of claim 36 wherein the drift layer is formed over a thinned silicon carbide substrate that was thinned after the drift layer was formed and a cathode contact is formed over a bottom surface of the thinned silicon carbide substrate.

38. The Schottky diode of claim 37 wherein the first surface of the drift layer comprises a plurality of junction barrier element recesses in the active region such that at least certain junction barrier elements of the array of junction barrier elements are doped regions that extend into the drift layer about corresponding ones of the plurality of junction barrier element recesses, and the doped regions are doped with a doping material of a second conductivity type, which is opposite the first conductivity type.

* * * * *